US012765435B2

(12) United States Patent
Yim et al.

(10) Patent No.: US 12,765,435 B2
(45) Date of Patent: Oct. 13, 2026

(54) 3D INTEGRATED CIRCUIT (3DIC) STRUCTURE AND METHOD FOR MANUFACTURING THE SAME

(71) Applicant: SAMSUNG ELECTRONICS CO., LTD., Suwon-si (KR)

(72) Inventors: Choongbin Yim, Suwon-si (KR); Jongkook Kim, Suwon-si (KR); Chengtar Wu, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 362 days.

(21) Appl. No.: 18/493,166

(22) Filed: Oct. 24, 2023

(65) Prior Publication Data

US 2024/0258221 A1 Aug. 1, 2024

(30) Foreign Application Priority Data

Jan. 27, 2023 (KR) ........................ 10-2023-0011147

(51) Int. Cl.

*H10W 90/00* (2026.01)
*H10W 70/05* (2026.01)
*H10W 70/60* (2026.01)
*H10W 70/685* (2026.01)
*H10W 72/00* (2026.01)

(Continued)

(52) U.S. Cl.

CPC ......... *H10W 90/701* (2026.01); *H10W 70/05* (2026.01); *H10W 70/093* (2026.01); *H10W 70/611* (2026.01); *H10W 70/685* (2026.01); *H10W 74/01* (2026.01); *H10W 74/117* (2026.01); *H10W 90/00* (2026.01); *H10W 72/072* (2026.01); *H10W 74/15* (2026.01); *H10W 90/722* (2026.01); *H10W 90/724* (2026.01); *H10W 90/732* (2026.01); *H10W 90/792* (2026.01)

(58) Field of Classification Search

None

See application file for complete search history.

(56) References Cited

U.S. PATENT DOCUMENTS 7,116,002 B2 * 10/2006 Chao .................... H10W 90/00 257/777
8,866,488 B2 10/2014 Wang et al.

(Continued)

FOREIGN PATENT DOCUMENTS

JP 2013197341 A 9/2013
KR 10-2015-0112861 A 10/2015
KR 10-2022-0150481 A 11/2022

*Primary Examiner* — Nduka E Ojeh

(74) *Attorney, Agent, or Firm* — Wolf, Greenfield & Sacks, P.C.

(57) ABSTRACT

A 3D integrated circuit structure includes a redistribution layer structure; a first semiconductor chip die on the redistribution layer structure; a plurality of core balls on the redistribution layer structure and adjacent the first semiconductor chip die; a molding material encapsulating the first semiconductor chip die and the plurality of core balls on the redistribution layer structure; an interconnection structure on the molding material; and a second semiconductor chip die on the interconnection structure. A footprint of the first semiconductor chip die and footprints of the plurality of core balls are within a footprint of the second semiconductor chip die.

20 Claims, 18 Drawing Sheets

100

(51) Int. Cl.
*H10W 74/01* (2026.01)
*H10W 74/10* (2026.01)
*H10W 74/15* (2026.01)

(56) References Cited

U.S. PATENT DOCUMENTS

| | | | | |
|---|---|---|---|---|
| 8,952,516 | B2 | 2/2015 | Zohni et al. | |
| 9,299,682 | B2 | 3/2016 | Hung et al. | |
| 9,813,043 | B2 | 11/2017 | Zuo et al. | |
| 10,510,733 | B2 | 12/2019 | Kumar et al. | |
| 11,205,644 | B2 | 12/2021 | Wu et al. | |
| 11,217,563 | B2 | 1/2022 | Zhai | |
| 2010/0237495 | A1* | 9/2010 | Pagaila | H10W 70/60 257/532 |
| 2015/0279759 | A1 | 10/2015 | Miyakoshi et al. | |
| 2017/0148766 | A1 | 5/2017 | Miyakoshi et al. | |
| 2020/0061757 | A1* | 2/2020 | Nishino | B23K 35/262 |
| 2020/0077510 | A1* | 3/2020 | Darveaux | H04B 1/40 |
| 2021/0296249 | A1 | 9/2021 | Khim et al. | |
| 2022/0352058 | A1 | 11/2022 | Lee et al. | |
| 2023/0057113 | A1* | 2/2023 | Tsai | H10P 72/74 |
| 2023/0317677 | A1* | 10/2023 | Song | H01L 24/19 257/668 |

* cited by examiner

3D INTEGRATED CIRCUIT (3DIC) STRUCTURE AND METHOD FOR MANUFACTURING THE SAME

CROSS-REFERENCE TO RELATED APPLICATION

This application claims priority to and the benefit of Korean Patent Application No. 10-2023-0011147 filed in the Korean Intellectual Property Office on Jan. 27, 2023, the disclosure of which is incorporated herein by reference in its entirety.

BACKGROUND OF THE INVENTION

(a) Field of the Invention

The present disclosure relates to a 3D integrated circuit (3DIC) structure and a method for manufacturing the same.

(b) Description of the Related Art

A semiconductor industry sector seeks to improve integration density so that more passive or active devices may be integrated within a given region. However, development of technology for miniaturizing a circuit line width of a front-end semiconductor process has gradually faced limitations so that the semiconductor industry sector is supplementing the limitations of the front end semiconductor process by developing technology of a semiconductor package that may have high integration density. Thus, a 3D integrated circuit (3DIC) capable of reducing a physical size of a semiconductor devise has been developed.

The 3D integrated circuit (3DIC) is a stacked semiconductor device manufactured by dividing a central processing unit (CPU), a graphics processing unit (GPU), a memory, a communication chip, a sensor, and the like into upper and lower wafers and performing an appropriate bonding process to bond the upper and lower wafers. The 3D integrated circuit (3DIC) has a small form factor, and provides great density to increase performance and reduce power consumption.

In the 3D integrated circuit (3DIC) having a stacked structure in which an area of a lower surface of an upper semiconductor chip die is larger than an area of an upper surface of a lower semiconductor chip die, the upper semiconductor chip die is respectively coupled to the lower semiconductor chip die and a front side redistribution layer (FRDL) structure. The upper semiconductor chip die and the front side redistribution layer (FRDL) structure are coupled by a metal post (e.g., a copper post).

However, in order to form a high metal post in a case of the metal post, the same processes such as exposure, development, etching, deposition, and the like have to be repeatedly performed. Thus, a turnaround time (TAT) increases, and there may be a risk in which yield is decreased.

Therefore, a new 3D integrated circuit (3DIC) technology may solve problems of conventional 3D integrated circuit (3DIC) technology.

SUMMARY OF THE INVENTION

An embodiment is to provide a 3D integrated circuit (3DIC) structure and a method for manufacturing the same capable of coupling an upper semiconductor chip die and a front side redistribution layer (FRDL) structure using a core ball instead of using a metal post (e.g., a copper post) to couple the upper semiconductor chip die and the front side redistribution layer (FRDL) structure in the 3D integrated circuit (3DIC) having a stacked structure in which an area of a lower surface of the upper semiconductor chip die is larger than an area of an upper surface of a lower semiconductor chip die.

A 3D integrated circuit structure according to an embodiment may include: a redistribution layer structure; a first semiconductor chip die on the redistribution layer structure; a plurality of core balls on the redistribution layer structure and adjacent the first semiconductor chip die; a molding material surrounding the first semiconductor chip die and the plurality of core balls; an interconnection structure on the molding material; and a second semiconductor chip die on the interconnection structure. A footprint of the first semiconductor chip die and footprints of the plurality of core balls may be within a footprint of the second semiconductor chip die.

Each core ball among the plurality of core balls may include an inner core and a first outer conductive layer covering the inner core.

Each core ball may further include an upper conductive connection member and a lower conductive connection member extending from the first outer conductive layer.

The inner core may include a plastic material including a thermoplastic resin, a thermosetting resin, or a polymer material.

The inner core may include copper or a copper alloy.

The first outer conductive layer may include an SAC solder alloy including tin (Sn), silver (Ag), and copper (Cu).

Each core ball may further include a second outer conductive layer covering the first outer conductive layer.

The plurality of core balls may be disposed aside one side of the first semiconductor chip die.

Some of the plurality of core balls may be adjacent one side of the first semiconductor chip die, and other ones of the plurality of core balls may be adjacent another side of the first semiconductor chip die.

A 3D integrated circuit structure according to another embodiment may include: a first redistribution layer structure; a molding material on the first redistribution layer structure; an interconnection structure on the molding material; a first semiconductor chip die is in the molding material and includes a first surface and a second surface opposite to the first surface, wherein the first surface is electrically coupled to the first redistribution layer structure and the second surface is electrically coupled to the interconnection structure; a plurality of core balls are in the molding material and adjacent the first semiconductor chip die, wherein one portion of each core ball among the plurality of core balls is electrically coupled to the first redistribution layer structure and an opposite portion of each core ball among the plurality of core balls is electrically coupled to the interconnection structure; and a second semiconductor chip die on the interconnection structure. A footprint of the first semiconductor chip die and footprints of the plurality of core balls may be within a footprint of the second semiconductor chip die.

The interconnection structure may include a second redistribution layer structure.

The interconnection structure may include a micro-bump.

The interconnection structure may include upper bonding pads and lower bonding pads.

The upper bonding pads and the lower bonding pads may be directly bonded to each other.

The first semiconductor chip die may include a through silicon via (TSV).

A method for manufacturing a 3D integrated circuit structure according to an embodiment may include: forming a first redistribution layer structure; bonding a plurality of core balls on the first redistribution layer structure; mounting a first semiconductor chip die on the first redistribution layer structure; encapsulating the first semiconductor chip die and the plurality of core balls with molding material; and electrically coupling a second semiconductor chip die to the first semiconductor chip die and the plurality of core balls. A footprint of the first semiconductor chip die and footprints of the plurality of core balls may be within a footprint of the second semiconductor chip die.

The bonding of the plurality of core balls on the first redistribution layer structure may be performed by a reflow process.

After the encapsulating of the first semiconductor chip die and the plurality of core balls, the method further includes performing a chemical-mechanical polishing (CMP) process on the molding material.

The electrical coupling of the second semiconductor chip die to the first semiconductor chip die and the plurality of core balls may include: forming a second redistribution layer structure on the first semiconductor chip die and the plurality of core balls; and mounting the second semiconductor chip die on the second redistribution layer structure.

The electrical coupling of the second semiconductor chip die to the first semiconductor chip die and the plurality of core balls may be performed by hybrid bonding.

According to an embodiment, an upper semiconductor chip die and a front side redistribution layer (FRDL) structure may be coupled using a core ball in a 3D integrated circuit (3DIC) having a stacked structure in which an area of a lower surface of the upper semiconductor chip die is larger than an area of an upper surface of a lower semiconductor chip die so that a manufacturing process is simplified and a yield is improved.

DETAILED DESCRIPTION OF THE EMBODIMENTS

Figure 1:
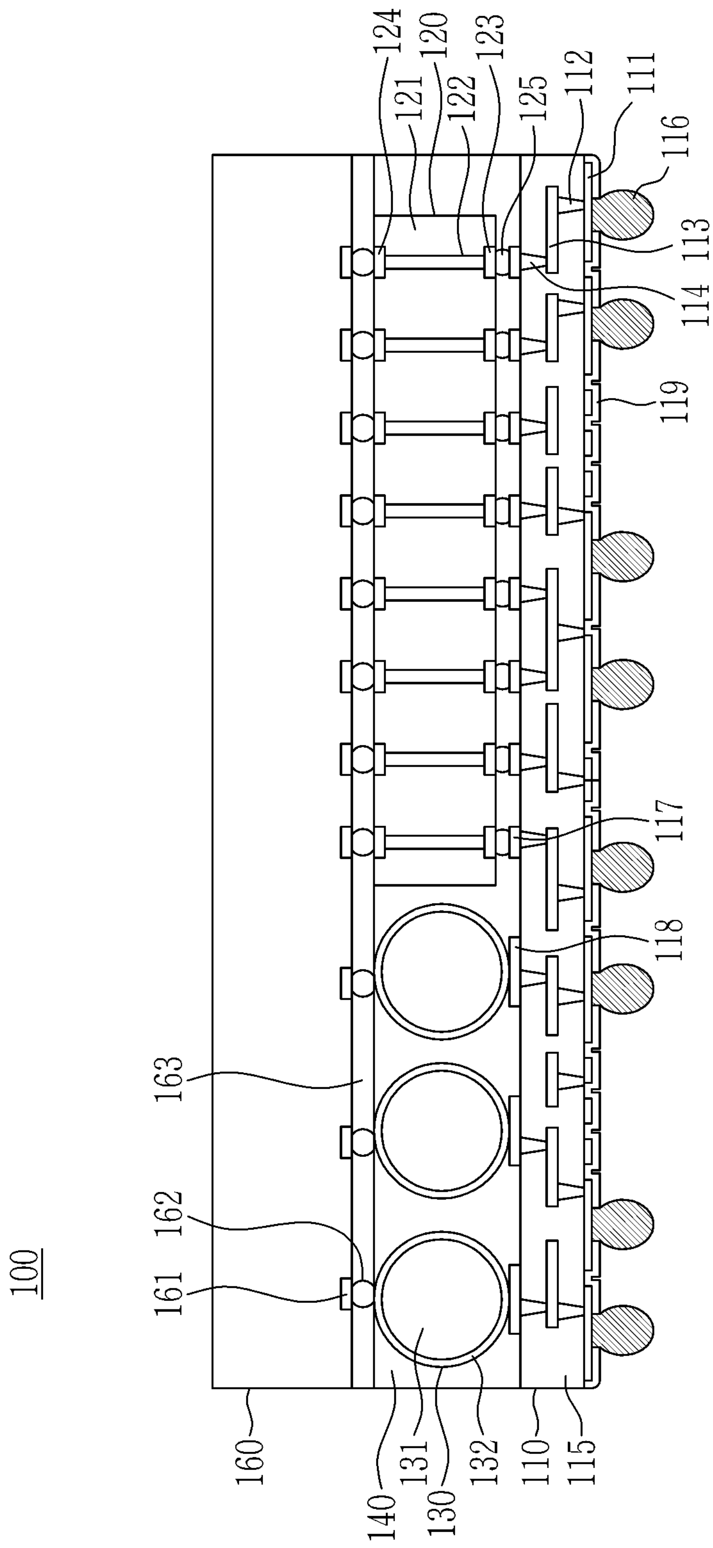
FIG. 1 is a cross-sectional view illustrating a 3D integrated circuit (3DIC) structure having a stacked structure according to an embodiment in which an area of a lower surface of a second semiconductor chip die disposed at an upper portion is larger than an area of an upper surface of a first semiconductor chip die disposed at a lower portion, the second semiconductor chip die and a front side redistribution layer (FRDL) structure are electrically coupled by core balls disposed at one side of the first semiconductor chip die, and the core balls and the first semiconductor chip die are bonded to the second semiconductor chip die by connection members.

The present disclosure will be described more fully hereinafter with reference to the accompanying drawings, in which embodiments of the disclosure are shown. As those skilled in the art would realize, the described embodiments may be modified in various different ways, all without departing from the scope of the present disclosure.

In order to clearly describe the present disclosure, parts or portions that are irrelevant to the description are omitted, and identical or similar constituent elements throughout the specification are denoted by the same reference numerals.

Further, in the drawings, the size and thickness of each element may be arbitrarily illustrated for ease of description, and the present disclosure is not necessarily limited to those illustrated in the drawings.

Throughout the specification, when a part is “connected” to another part, it includes not only a case where the part is “directly connected” but also a case where the part is “indirectly connected” with another part in between. In addition, unless explicitly described to the contrary, the word “comprise” and variations such as “comprises” or “comprising” will be understood to imply the inclusion of stated elements but not the exclusion of any other elements.

It will be understood that when an element such as a layer, film, region, area, or substrate is referred to as being “on” or “above” another element, it can be directly on the other element or intervening elements may also be present. In contrast, when an element is referred to as being “directly on” another element, there are no intervening elements present. Further, in the specification, the word “on” or “above” means positioned on or below the object portion, and does not necessarily mean positioned on the upper side of the object portion based on a gravitational direction.

Further, throughout the specification, the phrase “in a plan view” or “on a plane” means viewing a target portion from the top, and the phrase “in a cross-sectional view” or “on a cross-section” means viewing a cross-section formed by vertically cutting a target portion from the side.

Hereinafter, a 3D integrated circuit structure and a method for manufacturing the same according to an embodiment will be described with reference to the drawings.

The 3D integrated circuit (3DIC) structure 100 implements an integrated circuit as a three-dimensional single chip, and refers to a technology in which a circuit stacking method is converted from a conventional horizontal method to a vertical method. By using the vertical stacking method, more devices may be included at the same silicon wafer area so that manufacturing cost is reduced and performance is improved.

The 3D integrated circuit (3DIC) structure 100 may have a stacked structure in which a lower semiconductor chip die is larger than an upper semiconductor chip die, or a stacked structure in which the upper semiconductor chip die is larger than the lower semiconductor chip die. In the stacked structure in which the lower semiconductor chip die is larger than the upper semiconductor chip die, an entire lower surface of the upper semiconductor chip die is bonded to the lower semiconductor chip die by a connection member (e.g., a micro-bump) disposed below the upper semiconductor chip die. However, in the stacked structure in which the upper semiconductor chip die is larger than the lower semiconductor chip die, an additional interconnection member is required for a portion of a lower surface of the upper semiconductor chip die that is not bonded to an upper surface of the lower semiconductor chip die.

A technique of forming a metal post (e.g., a copper post) as the interconnection member is well known. However, since the metal post with a high aspect ratio is required according to technological advance and the same processes such as exposure, development, etching, deposition, and the like has to be repeatedly performed in order to form the metal post with the high aspect ratio, and there may be a risk in which a turnaround time (TAT) increases and a yield is decreased.

FIG. 1 is a cross-sectional view illustrating a 3D integrated circuit (3DIC) structure 100 having a stacked structure according to an embodiment in which an area of a lower surface of the second semiconductor chip die 160 disposed at the upper portion is larger than an area of an upper surface of the first semiconductor chip die 120 disposed at the lower portion, the second semiconductor chip die 160 and a front side redistribution layer (FRDL) structure 110 are electrically coupled by core balls 130 disposed at one side of the first semiconductor chip die 120, and the core balls 130 and the first semiconductor chip die 120 are bonded to the second semiconductor chip die 160 by connection members 162.

Referring to FIG. 1, the 3D integrated circuit (3DIC) structure 100 may include the front side redistribution layer (FRDL) structure 110, the first semiconductor chip die 120, the core balls 130, a molding material 140, the second semiconductor chip die 160, the connection member 162, an insulating member 163, and an external connection member 116.

The front side redistribution layer (FRDL) structure 110 may include a dielectric layer 115, first redistribution vias 112 within the dielectric layer 115, first redistribution lines 113, second redistribution vias 114, and bonding pads 117 and 118. In another embodiment, a redistribution layer structure including a fewer or greater number of redistribution lines, a fewer or greater number of redistribution vias, and a fewer or greater number of bonding pads is included within a scope of the present disclosure.

The first redistribution via 112 is disposed between the first redistribution line 113 and a bonding pad 111. The first redistribution via 112 electrically couples the first redistribution line 113 and the external connection member 116 connected to the bonding pad 111 in a first or vertical direction. The first redistribution line 113 is disposed between the first redistribution via 112 and the second redistribution via 114. The first redistribution line 113 electrically couples the first redistribution via 112 and the second redistribution via 114 in a second or horizontal direction. The second redistribution via 114 is disposed between the first redistribution line 113 and the bonding pads 117 and 118. The second redistribution via 114 electrically couples the first redistribution line 113 and the bonding pads 117 and 118 in a first or vertical direction. The bonding pad 117 is disposed between the second redistribution via 114 and a connection member 125, and electrically couples the second redistribution via 114 and the connection member 125. The bonding pad 118 is disposed between the second redistribution via 114 and the core ball 130, and electrically couples the second redistribution via 114 and the core ball 130.

The first semiconductor chip die 120 may include first semiconductor chips 121, through silicon vias (TSVs) 122, lower bonding pads 123, upper bonding pads 124, and connection members 125. In an embodiment, the first semiconductor chip 121 may include a central processing unit (CPU) or a graphics processing unit (GPU). The through silicon via (TSV) 122 is disposed between the lower bonding pad 123 and the upper bonding pad 124. The through silicon via (TSV) 122 electrically couples the lower bonding pad 123 and the upper bonding pad 124.

Since the second semiconductor chip die 160 is disposed spaced apart from the front side redistribution layer (FRDL) structure 110 that transfers a signal and power in the 3D integrated circuit (3DIC) structure 100, the through silicon via (TSV) 122 may be disposed between the first semiconductor chips 121 of the first semiconductor chip die 120 and may be connected to the second semiconductor chip die 160 so that a speed at which the second semiconductor chip die 160 receives a signal and power and responds to the signal and the power is increased.

The lower bonding pad 123 is disposed between the TSV 122 and the connection member 125, and electrically couples the TSV 122 and the connection member 125. The upper bonding pad 124 is disposed between the through silicon via (TSV) 122 and the connection member 162. The upper bonding pad 124 electrically couples the through silicon via (TSV) 122 and the second semiconductor chip die 160 connected to the connection member 162. The connection member 125 is disposed between the lower bonding pad 123 and the front side redistribution layer (FRDL) structure 110. The connection member 125 electrically couples the lower bonding pad 123 and the front side redistribution layer (FRDL) structure 110.

The core ball 130 is disposed between the front side redistribution layer (FRDL) structure 110 and the connection member 162, and electrically couples the front side redistribution layer (FRDL) structure 110 and the connection member 162. As described above, in a stacked structure in which the second semiconductor chip die 160 is larger than the first semiconductor chip die 120, an interconnection member for a portion of a lower surface of the second semiconductor chip die 160 that is not bonded to an upper surface of the first semiconductor chip die 120 may use pre-manufactured core balls 130 instead of metal posts so that a manufacturing process is simplified and a yield is improved.

The second semiconductor chip die 160 may include second semiconductor chips (not shown) and bonding pads 161. In an embodiment, the second semiconductor chip (not shown) may include a communication chip or a sensor.

The connection member 162 that is an interconnection structure, is disposed between the bonding pad 161 and the core ball 130 or between the bonding pad 161 and the first semiconductor chip die 120, and electrically couples the bonding pad 161 and the core ball 130 or the bonding pad 161 and the first semiconductor chip die 120. In an embodiment, the connection member 162 may include a micro-bump.

The insulating member 163 surrounds the connection member 162 between the second semiconductor chip die 160 and the core ball 130 and between the second semiconductor chip die 160 and the first semiconductor chip die 120.

The external connection member 116 electrically couples the front side redistribution layer (FRDL) structure 110 to an external configuration through bonding pads 111 disposed below a lower surface of the front side redistribution layer (FRDL) structure 110. An insulating layer 119 may include a plurality of openings for soldering. In an embodiment, the insulating layer 119 may include a solder resist. The insulating layer 119 prevents the external connection member 116 from being short-circuited.

Figure 2:
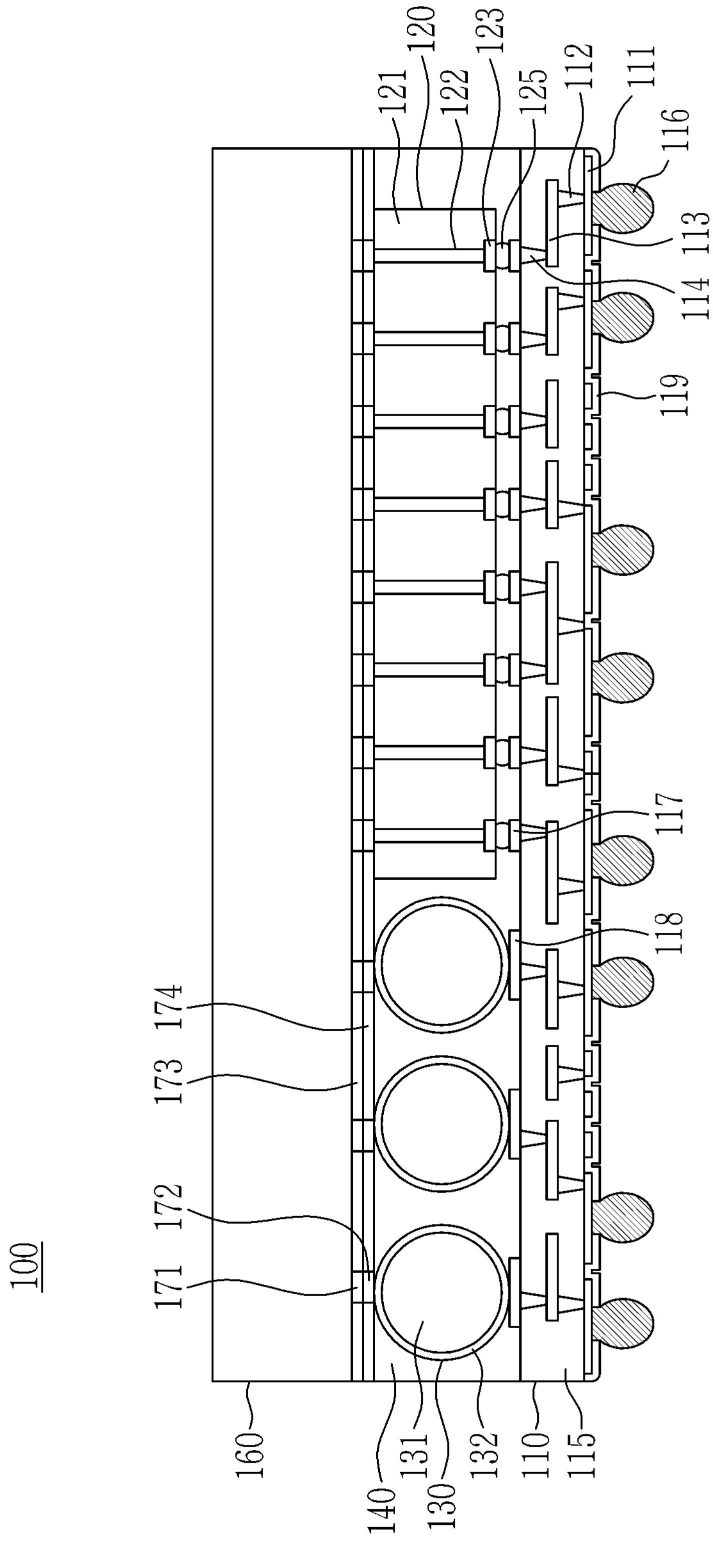
FIG. 2 is a cross-sectional view illustrating a 3D integrated circuit (3DIC) structure having a stacked structure according to an embodiment in which the area of the lower surface of the second semiconductor chip die disposed at the upper portion is larger than the area of the upper surface of the first semiconductor chip die disposed at the lower portion, the second semiconductor chip die and the front side redistribution layer (FRDL) structure are electrically coupled by the core balls disposed at the one side of the first semiconductor chip die, and the core balls and the first semiconductor chip die are bonded to the second semiconductor chip die by hybrid bonding.

FIG. 2 is a cross-sectional view illustrating a 3D integrated circuit (3DIC) structure 100 having a stacked structure according to an embodiment in which the area of the lower surface of the second semiconductor chip die 160 disposed at the upper portion is larger than the area of the upper surface of the first semiconductor chip die 120 disposed at the lower portion, the second semiconductor chip die 160 and the front side redistribution layer (FRDL) structure 110 are electrically coupled by the core balls 130 disposed at one side of the first semiconductor chip die 120 as illustrated, and the core balls 130 and the first semiconductor chip die 120 are bonded to the second semiconductor chip die 160 by hybrid bonding.

Referring to FIG. 2, in the 3D integrated circuit (3DIC) structure 100, the core balls 130 and the first semiconductor chip die 120 may be bonded to the second semiconductor chip die 160 by the hybrid bonding. Bonding pads 171 and 172 and silicon insulating layers 173 and 174 may be interconnection structures, and may be disposed at upper portions of the core balls 130 and the first semiconductor chip die 120 and below the second semiconductor chip die 160.

The bonding pads 172 are directly bonded to the bonding pads 171 by metal-metal hybrid bonding, and the silicon insulating layer 174 is directly bonded to the silicon insulating layer 173 by non-metal-non-metal hybrid bonding.

In an embodiment, the bonding pads 171 and 172 may include copper. In another embodiment, the bonding pads 171 and 172 may be a metallic material to which the hybrid bonding may be applied. In an embodiment, the silicon insulating layers 173 and 174 may include a silicon oxide. In an embodiment, the silicon insulating layers 173 and 174 may include $SiO_2$. In another embodiment, the silicon insulating layers 173 and 174 may be a silicon nitride, a silicon oxynitride, or another suitable dielectric material.

A feature of a configuration of the 3D integrated circuit (3DIC) structure 100 of FIG. 1 described above may be equally applied to a configuration of the 3D integrated circuit (3DIC) structure 100 of FIG. 2 other than a configuration in which the core balls 130 and the second semiconductor chip die 160, and the first semiconductor chip die 120 and the second semiconductor chip die 160 are bonded and electrically coupled by the hybrid bonding.

Figure 3:
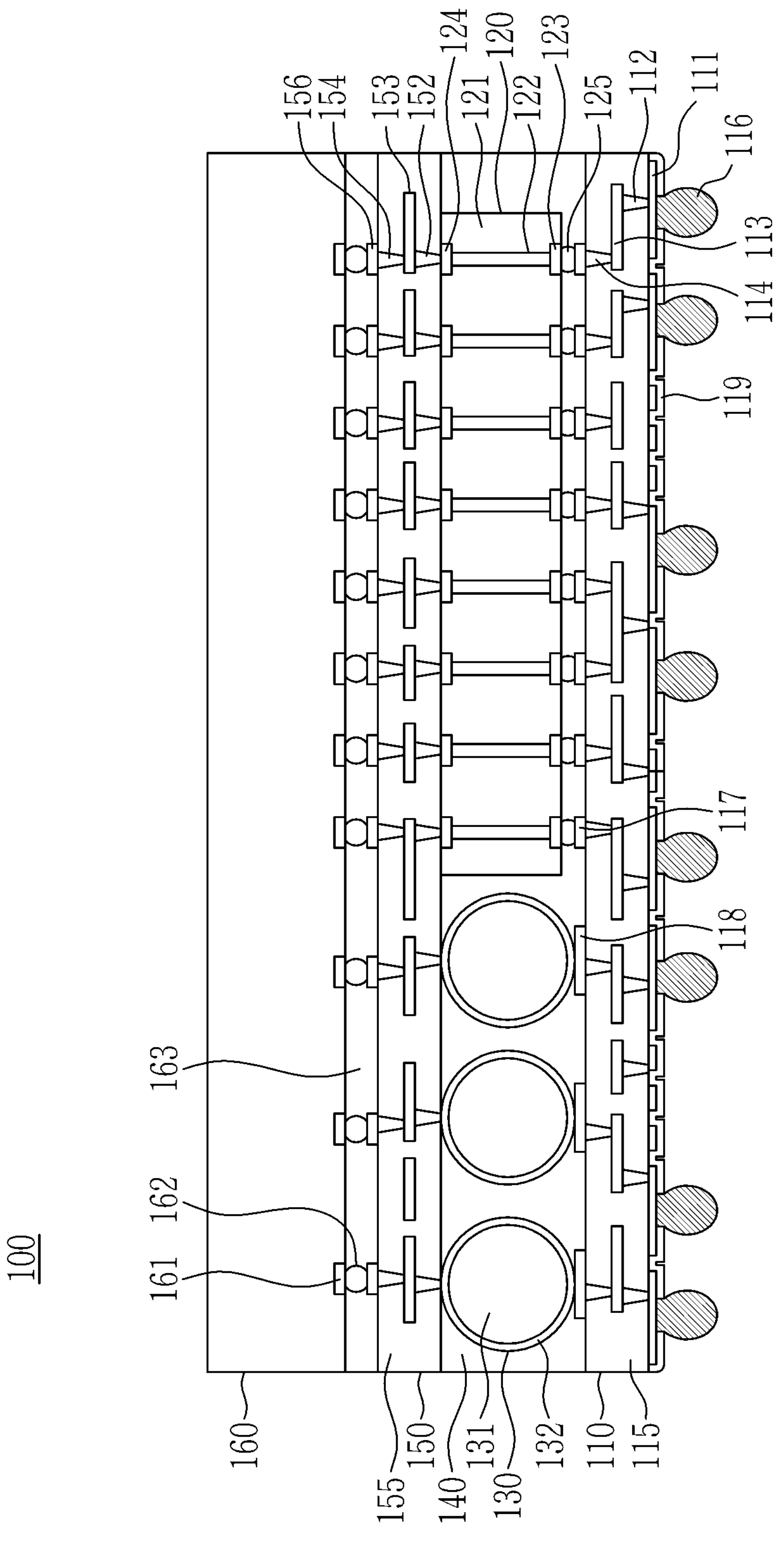
FIG. 3 is a cross-sectional view illustrating a 3D integrated circuit (3DIC) structure having a stacked structure according to an embodiment in which the area of the lower surface of the second semiconductor chip die disposed at the upper portion is larger than the area of the upper surface of the first semiconductor chip die disposed at the lower portion, a back side redistribution layer (BRDL) structure and the front side redistribution layer (FRDL) structure are electrically coupled by the core balls disposed at the one side of the first semiconductor chip die, and the core balls and the first semiconductor chip die are bonded to the second semiconductor chip die by the back side redistribution layer (BRDL) structure.

FIG. 3 is a cross-sectional view illustrating a 3D integrated circuit (3DIC) structure 100 having a stacked structure according to an embodiment in which the area of the lower surface of the second semiconductor chip die 160 disposed at the upper portion is larger than the area of the upper surface of the first semiconductor chip die 120 disposed at the lower portion, a back side redistribution layer (BRDL) structure 150 and the front side redistribution layer (FRDL) structure 110 are electrically coupled by the core balls 130 disposed at the one side of the first semiconductor chip die 120, and the core balls 130 and the first semiconductor chip die 120 are bonded to the second semiconductor chip die 160 by the back side redistribution layer (BRDL) structure 150.

Referring to FIG. 3, the core balls 130 and the first semiconductor chip die 120 may be bonded to the second semiconductor chip die 160 by the back side redistribution layer (BRDL) structure 150 that functions as an interconnection structure.

The back side redistribution layer (BRDL) structure 150 may include a dielectric layer 155, third redistribution vias 152, second redistribution lines 153, fourth redistribution vias 154, and bonding pads 156 within the dielectric layer 155, second redistribution lines 153, fourth redistribution vias 154, and bonding pads 156. In another embodiment, a redistribution layer structure including a fewer or greater number of redistribution lines, a fewer or greater number of redistribution vias, and a fewer or greater number of bonding pads is included within a scope of the present disclosure.

The third redistribution via 152 is disposed between the second redistribution line 153 and the bonding pad 124 and between the second redistribution line 153 and the core balls 130. The third redistribution via 152 electrically couples the second redistribution line 153 and the bonding pad 124 in a first or vertical direction, and electrically couples the second redistribution line 153 and the core balls 130 in a first or vertical direction. The second redistribution line 153 is disposed between the third redistribution via 152 and a fourth redistribution via 154. The second redistribution line 153 electrically couples the third redistribution via 152 and the fourth redistribution via 154 in a second or horizontal direction. The fourth redistribution via 154 is disposed between the second redistribution line 153 and the bonding pad 156. The fourth redistribution via 154 electrically couples the second redistribution line 153 and the bonding pad 156 in a first or vertical direction. The bonding pad 156 is disposed between the fourth redistribution via 154 and the connection member 162, and electrically couples the fourth redistribution via 154 and the connection member 162.

A feature of a configuration of the 3D integrated circuit (3DIC) structure 100 of FIG. 1 described above may be equally applied to a configuration of the 3D integrated circuit (3DIC) structure 100 of FIG. 3 other than a configuration in which the core balls 130 and the second semiconductor chip die 160, and the first semiconductor chip die 120 and the second semiconductor chip die 160, are bonded by the back side redistribution layer (BRDL) structure.

Figure 4:
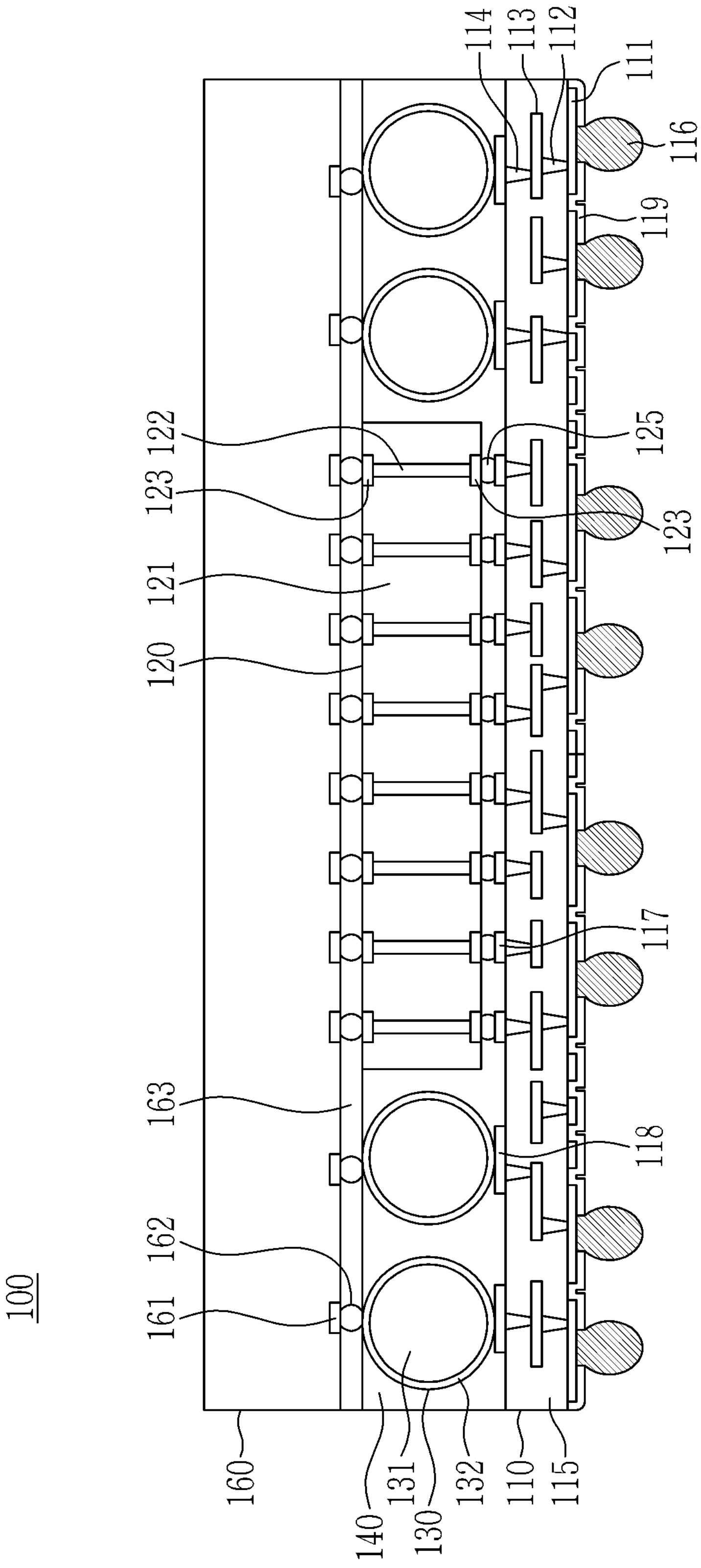
FIG. 4 is a cross-sectional view illustrating a 3D integrated circuit (3DIC) structure having a stacked structure according to an embodiment in which the area of the lower surface of the second semiconductor chip die disposed at the upper portion is larger than the area of the upper surface of the first semiconductor chip die disposed at the lower portion, the core balls are disposed aside side surfaces of the first semiconductor chip die so that the second semiconductor chip die and the front side redistribution layer (FRDL) structure are electrically coupled, and the core balls and the first semiconductor chip die are bonded to the second semiconductor chip die by the connection members.

FIG. 4 is a cross-sectional view illustrating a 3D integrated circuit (3DIC) structure 100 having a stacked structure according to an embodiment in which the area of the lower surface of the second semiconductor chip die 160 disposed at the upper portion is larger than the area of the upper surface of the first semiconductor chip die 120 disposed at the lower portion, the core balls 130 are disposed adjacent side surfaces of the first semiconductor chip die 120 as illustrated so that the second semiconductor chip die 160 and the front side redistribution layer (FRDL) structure 110 are electrically coupled, and the core balls 130 and the first semiconductor chip die 120 are bonded to the second semiconductor chip die by the connection members 162.

Referring to FIG. 4, the core balls 130 may be disposed adjacent to the side surfaces of the first semiconductor chip die 120. Since the area of the lower surface of the upper second semiconductor chip die 160 is larger than the area of the upper surface of the lower first semiconductor chip die 120, various dispositions of the core balls 130 and the first semiconductor chip die 120 above the front side redistribution layer (FRDL) structure 110 may be considered according to types, disposition, connection relationship, or the like of the semiconductor chips included in the first semiconductor chip die 120 and the second semiconductor chip die 160. Accordingly, the core balls 130 may be disposed adjacent to the side surfaces of the first semiconductor chip die 120, and a footprint of the first semiconductor chip die 120 and footprints of the core balls 130 are included within a footprint of the second semiconductor chip die 160.

Figure 5:
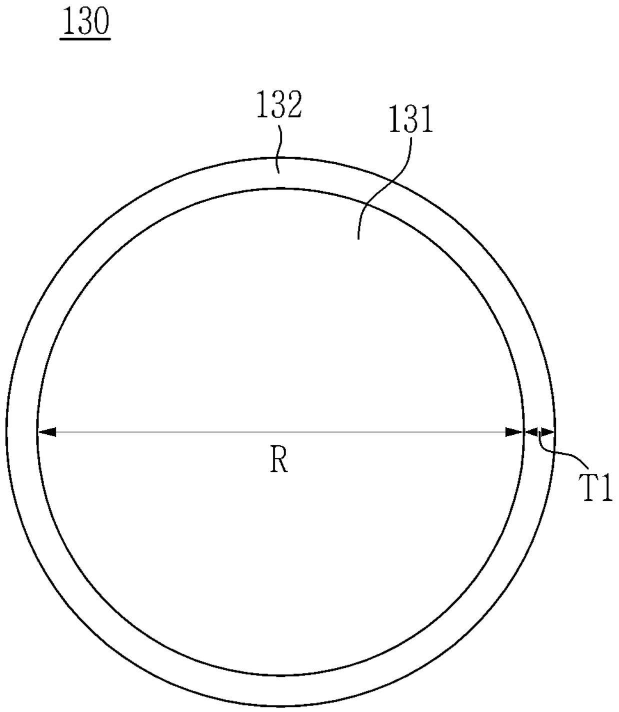
FIG. 5 is a cross-sectional view showing a core ball including an inner core and a first outer conductive layer according to an embodiment.

FIG. 5 is a cross-sectional view showing the core ball 130 including an inner core 131 and a first outer conductive layer 132 according to an embodiment.

Referring to FIG. 5, the core ball 130 may include the inner core 131 and the first outer conductive layer 132 covering the inner core 131. Further, although not shown in the drawings, the core ball 130 may include at least one of a nickel layer and a copper layer between the inner core 131 and the first outer conductive layer 132.

The core ball 130 serves as a support structure between the front side redistribution layer (FRDL) structure 110 disposed at a lower portion and the upper second semiconductor chip die 160 by the inner core 131. The inner core 131 may relieve stress applied to the core ball 130 from the front side redistribution layer (FRDL) structure 110 and the second semiconductor chip die 160, and may allow the core balls 130 to have a uniform height so that a distance between the front side redistribution layer (FRDL) structure 110 and the second semiconductor chip die 160 is maintained constant.

In an embodiment, the inner core 131 may include a plastic material, a polymer material, or a metal. In an embodiment, the plastic material may include a thermosetting resin, a thermoplastic resin, or an elastomer. In an embodiment, the thermosetting resin may include an epoxy-based resin, a melamine-formaldehyde-based resin, a benzoguanamine-formaldehyde-based resin, a divinylbenzene resin, a divinyl ether resin, an oligo resin, a polydiacrylate resin, or an alkylene bisacrylamide resin. In an embodiment, the thermoplastic resin may include a polyvinyl chloride resin, a polyethylene resin, a polystyrene resin, a nylon resin, or a polyacetal resin. In an embodiment, the polymer material may include a natural rubber or a synthetic rubber. In an embodiment, the metal may include copper or a copper alloy. In an embodiment, a diameter or a width R of a cross-section of the inner core 131 may be about 10 μm to 300 μm.

The core ball 130 serves to transmit a signal between the front side redistribution layer (FRDL) structure 110 disposed at a lower portion and the upper second semiconductor chip die 160 by the first outer conductive layer 132. In an embodiment, the first outer conductive layer 132 may include a Sn—Ag—Cu (SAC) solder alloy including tin, silver, and copper. In another embodiment, the first outer conductive layer 132 may include at least one of gold, silver, nickel, zinc, tin, aluminum, chromium, antimony, and an alloy thereof. In an embodiment, a thickness T1 of the first outer conductive layer 132 may be about 1 μm to 5 μm.

Figure 6:
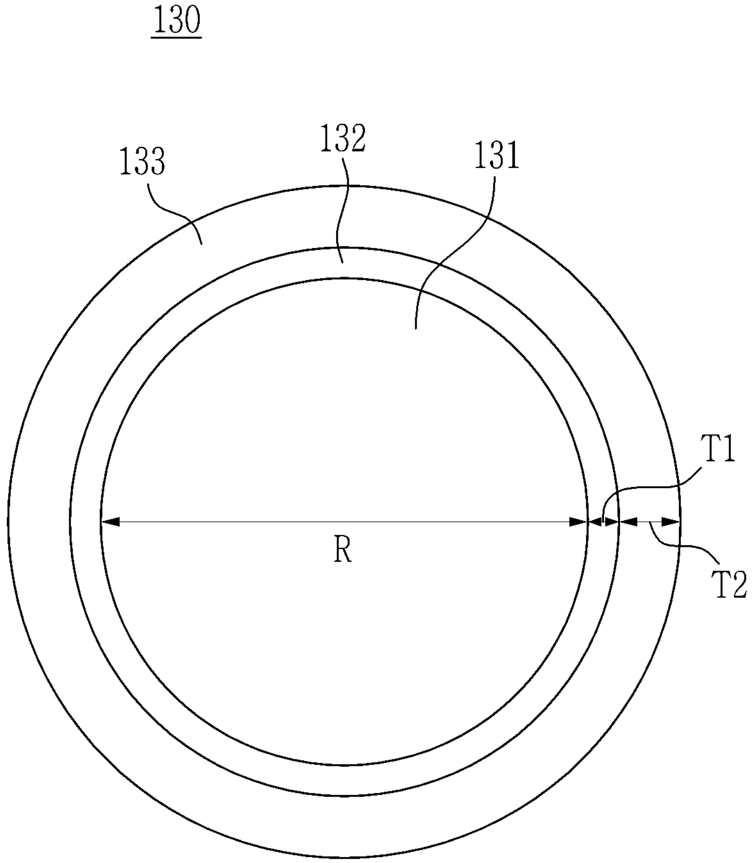
FIG. 6 is a cross-sectional view showing a core ball including an inner core, a first outer conductive layer, and a second outer conductive layer according to an embodiment.

FIG. 6 is a cross-sectional view showing the core ball 130 including the inner core 131, the first outer conductive layer 132, and a second outer conductive layer 133 according to an embodiment.

Referring to FIG. 6, the core ball 130 may include the second outer conductive layer 133 covering the first outer conductive layer 132. The second conductive layer 133 is further added to the first outer conductive layer 132 of the core ball 130 so that a speed at which a signal and power is transferred between the front side redistribution layer (FRDL) structure 110 disposed at a lower portion and the upper second semiconductor chip die 160 is improved. In an embodiment, the second outer conductive layer 133 may be a SAC solder alloy including tin, silver, and copper. In another embodiment, the second outer conductive layer 133 may include at least one of copper, gold, silver, nickel, zinc, tin, aluminum, chromium, antimony, and an alloy thereof. In one embodiment, a thickness T2 of the second outer conductive layer 133 may be about 5 μm to 50 μm.

Figure 7:
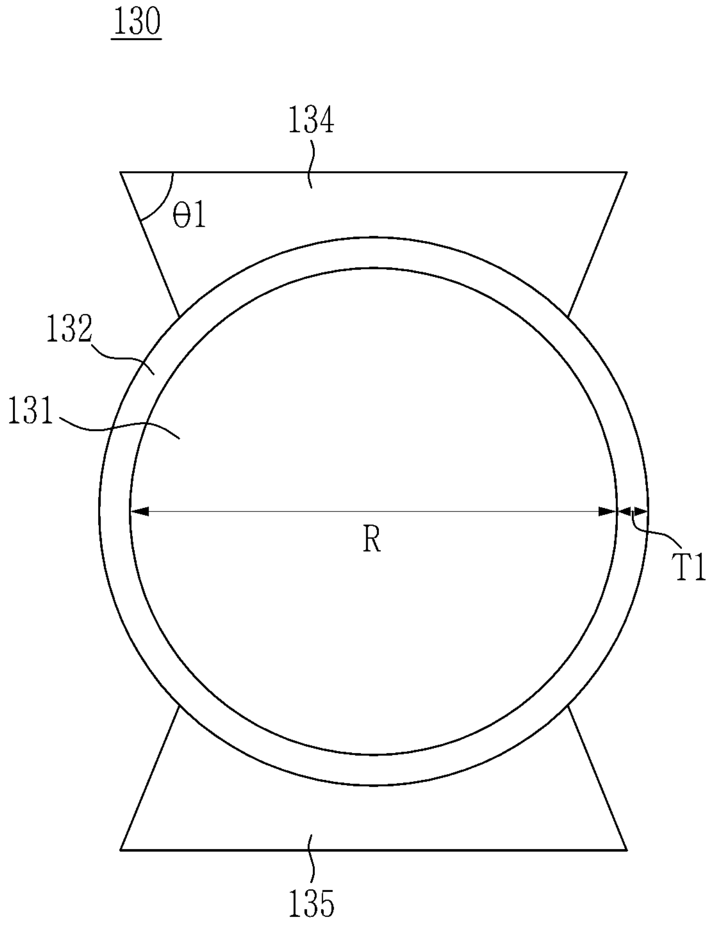
FIG. 7 is a cross-sectional view showing a core ball including an inner core, a first outer conductive layer, and conductive connection members according to an embodiment.

FIG. 7 is a cross-sectional view showing the core ball 130 including the inner core 131, the first outer conductive layer 132, and conductive connection members 134 and 135 according to an embodiment.

Referring to FIG. 7, the core ball 130 may include the upper conductive connection member 134 and the lower conductive connection member 135 connected to the first outer conductive layer 132. Each of the upper conductive connection member 134 and the lower conductive connection member 135 may include a flat bonding surface. The flat bonding surfaces of the upper conductive connection member 134 and the lower conductive connection member 135 serve to facilitate bonding between bonding surfaces when the core ball 130 is bonded to another pad or the like through a reflow process. Each of the upper conductive connection member 134 and the lower conductive connection member 135 may include a side surface that extends from the first outer conductive layer 132 and forms an angle 81 of 90° or less with the bonding surface. It is to maximize an area of the flat bonding surface that extends from the first outer conductive layer 132 of the upper conductive connection member 134 and the lower conductive connection member 135 and has a constant slope, and it serves to cause reflow to be performed within the flat bonding surface when the reflow process is performed.

Figure 8:
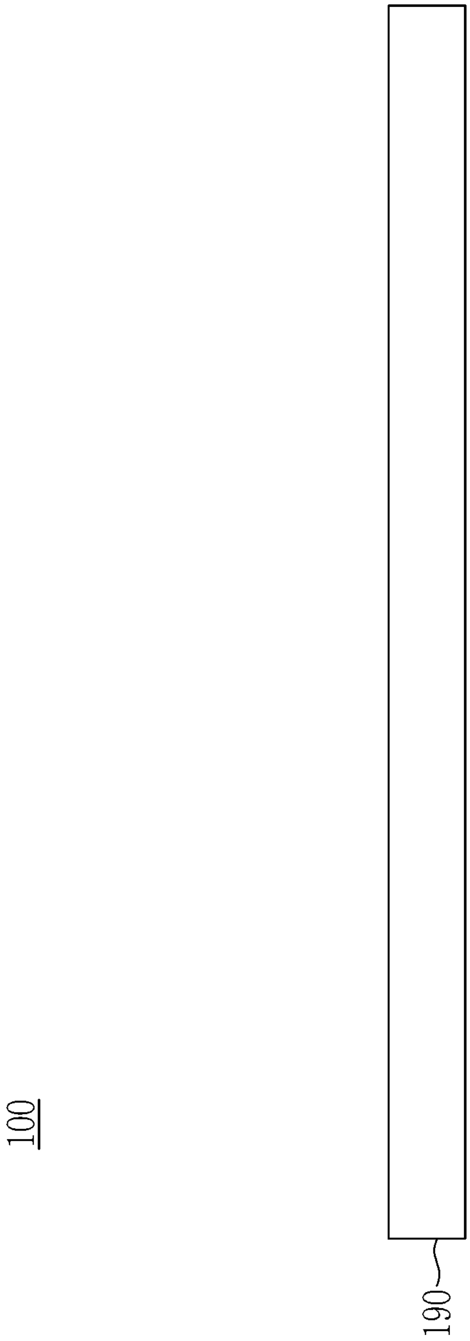
FIG. 8 is a cross-sectional view illustrating a step of providing a carrier as one of a series of steps of a method for manufacturing the 3D integrated circuit (3DIC) structure.

FIG. 8 is a cross-sectional view illustrating a step of providing a carrier 190 as one of a series of steps of a method for manufacturing the 3D integrated circuit (3DIC) structure 100.

Referring to FIG. 8, the carrier 190 is provided. For example, the carrier 190 may include a silicon-based material such as glass or a silicon oxide, another material such as an organic material or an aluminum oxide, any combination thereof, or the like. A release layer (not shown) may be disposed above or on the carrier 190. The release layer may be formed of multiple layers, and for example, may include an adhesive layer and a release layer. The release layer may function to adhere the front side redistribution layer (FRDL) structure 110 and the carrier 190. The release layer may be removed along with the carrier 190 from the front side redistribution layer (FRDL) structure 110. An upper surface of the release layer may be flat, and may have a high f coplanarity.

In an embodiment, the release layer may include a polymer-based material. In an embodiment, the release layer may include a light-to-heat-conversion (LTHC) release coating material, and may be thermal-released by heating. In another embodiment, the release layer may include a UV adhesive that is peeled off by ultra-violet (UV) light. In another embodiment, the release layer may be peeled off by a physical method. In another embodiment, the release layer may be applied in a liquid and cured state. In another embodiment, the release layer may be a laminate film laminated above or on the carrier 190.

Figure 9:
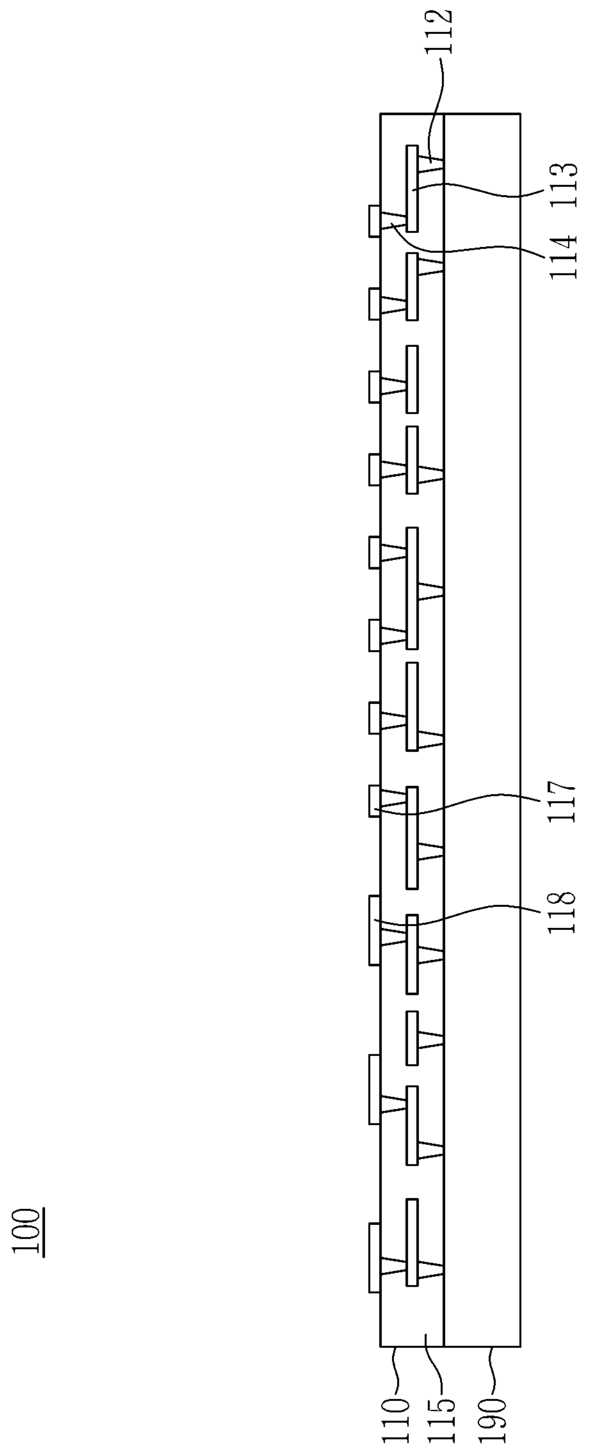
FIG. 9 is a cross-sectional view illustrating a step of forming the front side redistribution layer (FRDL) structure on the carrier as one of a series of steps of the method for manufacturing the 3D integrated circuit (3DIC) structure.

FIG. 9 is a cross-sectional view illustrating a step of forming the front side redistribution layer (FRDL) structure 110 on the carrier 190 as one of a series of steps of the method for manufacturing the 3D integrated circuit (3DIC) structure 100.

Referring to FIG. 9, the front side redistribution layer (FRDL) structure 110 is formed on the carrier 190.

First, the dielectric layer 115 is formed on the carrier 190. In an embodiment, the front side redistribution layer (FRDL) structure 110 may include a photosensitive polymer layer. The photosensitive polymer is a material capable of forming a fine pattern by applying a photolithography process. In an embodiment, the front side redistribution layer (FRDL) structure 110 may include a photoimageable dielectric (PID) used in a redistribution process. As an example, the photoimageable dielectric (PID) may include a polyimide-based photosensitive polymer, a novolac-based photosensitive polymer, polybenzoxazole, a silicone-based polymer, an acrylate-based polymer, or an epoxy-based polymer. In an embodiment, the photoimageable dielectric (PID) may have a resolution of about 3 μm. In another embodiment, the dielectric layer 115 is formed of a polymer such as PBO, polyimide, or the like. In another embodiment, the dielectric layer 115 is formed of an inorganic dielectric material such as a silicon nitride, a silicon oxide, or the like. In an embodiment, the dielectric layer 115 may be formed by a CVD, ALD, or PECVD process.

After the dielectric layer 115 is formed, via holes are formed by selectively etching the dielectric layer 115, and the first redistribution vias 112 are formed by filling the via holes with a conductive material.

Next, the dielectric layer 115 is additionally deposited on the first redistribution vias 112 and the dielectric layer 115, the additionally deposited dielectric layer 115 is selectively etched to form openings, and the first redistribution lines 113 are formed by filling the openings with a conductive material.

Next, the dielectric layer 115 is additionally deposited on the first redistribution lines 113 and the dielectric layer 115, the additionally deposited dielectric layer 115 is selectively etched to form via holes, and the second redistribution vias 114 are formed by filling the via holes with a conductive material.

In an embodiment, the first redistribution vias 112, the first redistribution lines 113, and the second redistribution vias 114 may include at least one of copper, aluminum, tungsten, nickel, gold, tin, titanium, and an alloy thereof. In an embodiment, the first redistribution vias 112, the first redistribution lines 113, and the second redistribution vias 114 may be formed by performing a sputtering process. In another embodiment, the first redistribution vias 112, the first redistribution lines 113, and the second redistribution vias 114 may be formed by performing an electroplating process after forming a seed metal layer.

Thereafter, the bonding pads 117 and 118 are formed on the dielectric layer 115 to be electrically coupled to the second redistribution vias 114 of the front side redistribution layer (FRDL) structure 110. Each of the bonding pads 117 and 118 may include at least one of copper, aluminum, silver, tin, gold, nickel, lead, titanium, and an alloy thereof. In an embodiment, the bonding pads 117 and 118 may be formed by performing a sputtering process. In another embodiment, the bonding pads 117 and 118 may be formed by performing an electroplating process after forming a seed metal layer.

Figure 10:
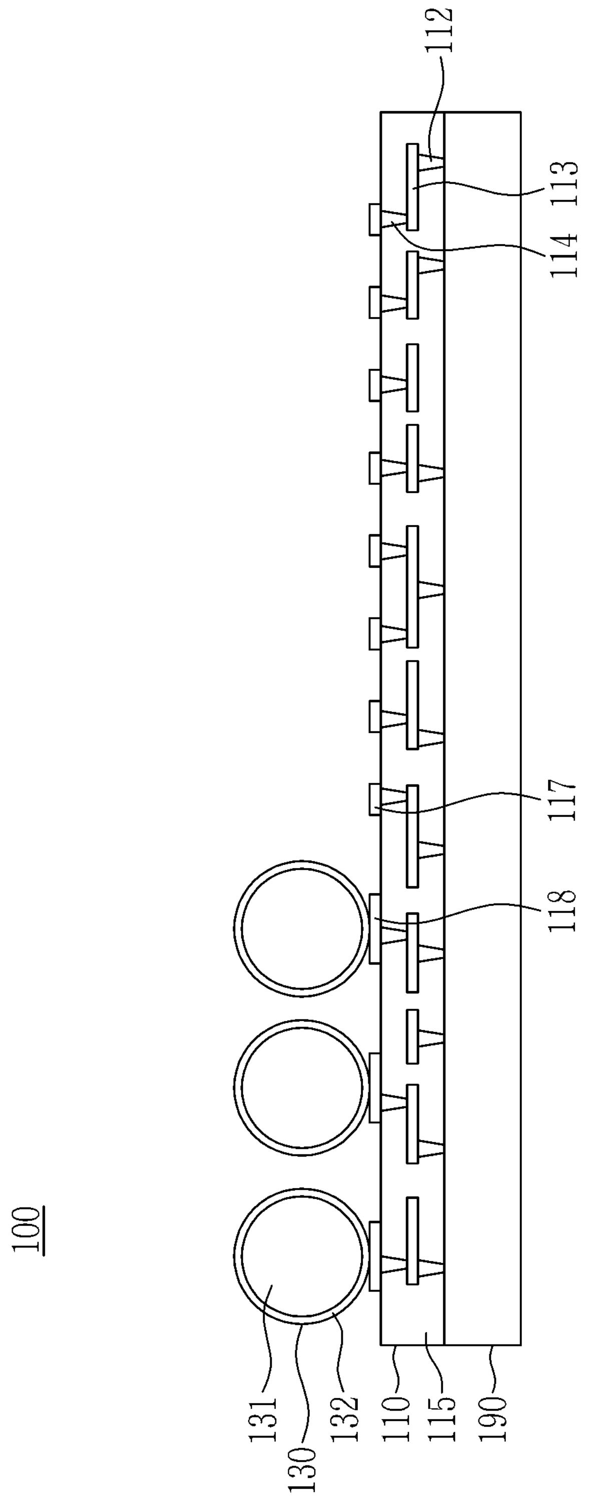
FIG. 10 is a cross-sectional view illustrating a step of bonding core balls on the front side redistribution layer (FRDL) structure as one of a series of steps of the method for manufacturing the 3D integrated circuit (3DIC) structure.

FIG. 10 is a cross-sectional view illustrating a step of bonding the core balls 130 above or on the front side redistribution layer (FRDL) structure 110 as one of a series of steps of the method for manufacturing the 3D integrated circuit (3DIC) structure 100.

Referring to FIG. 10, the core balls 130 are bonded by performing a reflow process on the bonding pads 118 of the front side redistribution layer (FRDL) structure 110.

Figure 11:
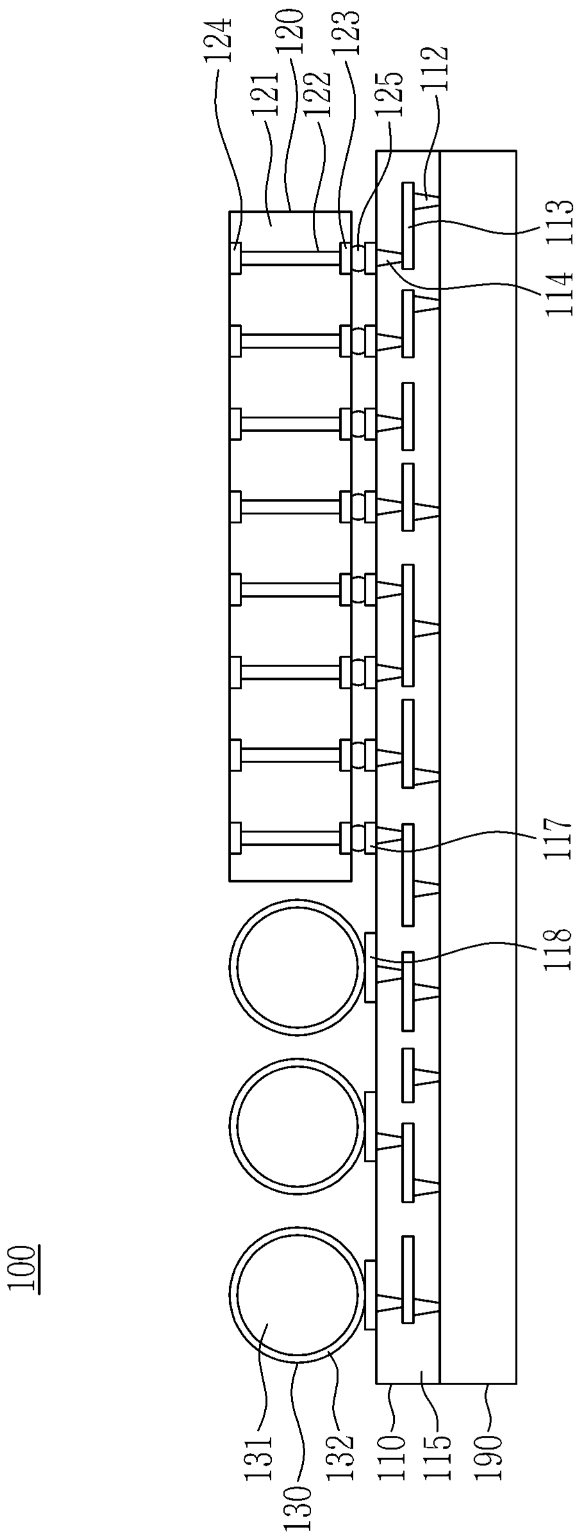
FIG. 11 is a cross-sectional view illustrating a step of mounting the first semiconductor chip die on the front side redistribution layer (FRDL) structure as one of a series of steps of the method for manufacturing the 3D integrated circuit (3DIC) structure.

FIG. 11 is a cross-sectional view illustrating a step of mounting the first semiconductor chip die 120 on the front side redistribution layer (FRDL) structure as one of a series of steps of the method for manufacturing the 3D integrated circuit (3DIC) structure 100.

Referring to FIG. 11, the first semiconductor chip die 120 is bonded on the front side redistribution layer (FRDL) structure 110. Specifically, the bonding pad 117 of the front side redistribution layer (FRDL) structure 110 and the lower bonding pad 123 of the first semiconductor chip die 120 are bonded by the connection member 125 to be electrically coupled to each other. In an embodiment, the connection member 125 may include a micro-bump.

Figure 12:
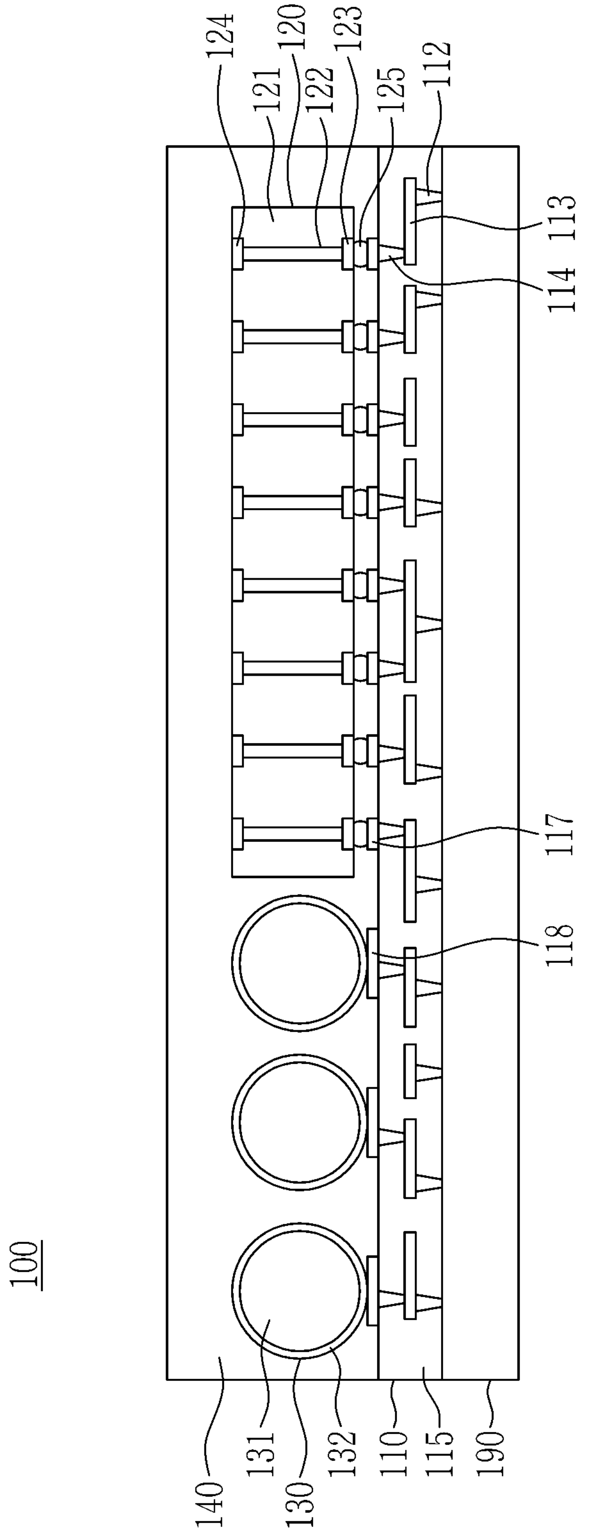
FIG. 12 is a cross-sectional view illustrating a step of molding the core balls and the first semiconductor chip die with a molding material as one of a series of steps of the method for manufacturing the 3D integrated circuit (3DIC) structure.

FIG. 12 is a cross-sectional view illustrating a step of molding (i.e., encapsulating) the core balls 130 and the first semiconductor chip die 120 with a molding material 140 as one of a series of steps of the method for manufacturing the 3D integrated circuit (3DIC) structure 100.

Referring to FIG. 12, the core balls 130 and the first semiconductor chip die 120 are molded with the molding material 140 on the front side redistribution layer (FRDL) structure 110 (i.e., the molding material 140 encapsulates or surrounds the core balls 130 and the first semiconductor chip die 120, as illustrated). In an embodiment, a process of molding with the molding material 140 may include a compression molding or transfer molding process. In an embodiment, the molding material 140 may be formed of a thermosetting resin such as an epoxy resin. In another embodiment, the molding material 140 may be an epoxy molding compound (EMC).

Figure 13:
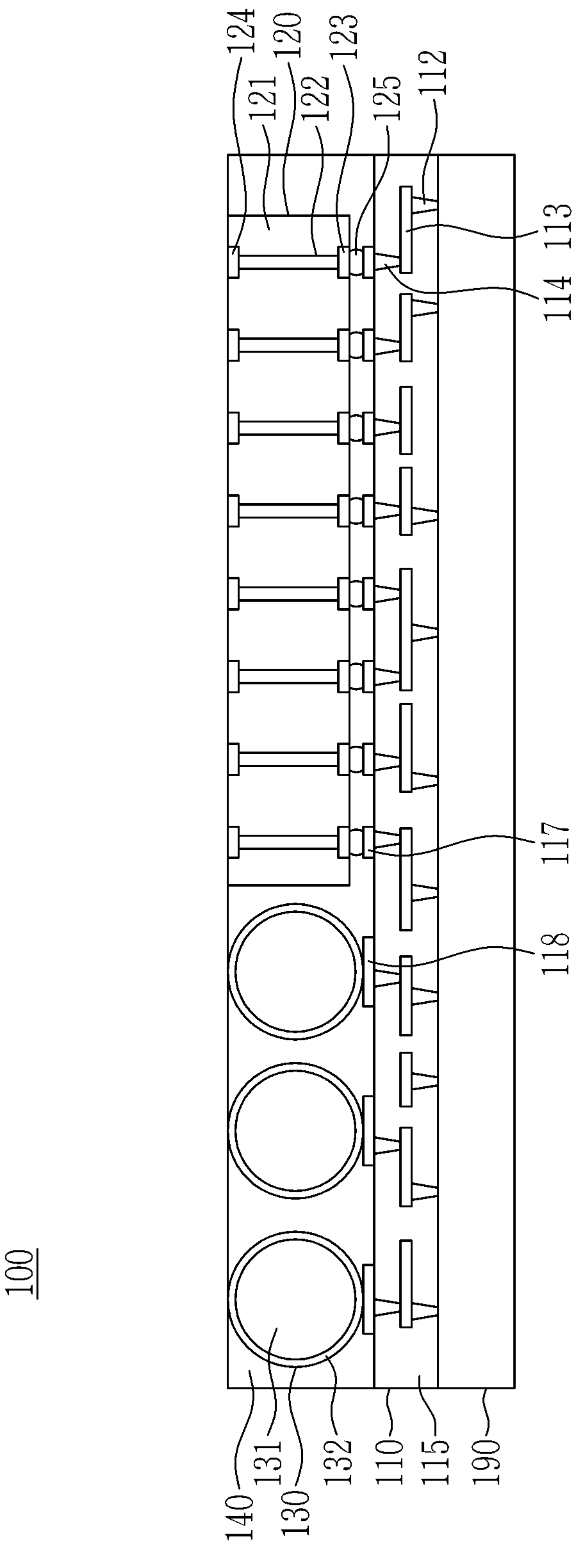
FIG. 13 is a cross-sectional view showing a step of planarizing an upper surface of the molding material as one of a series of steps of the method for manufacturing the 3D integrated circuit (3DIC) structure.

FIG. 13 is a cross-sectional view showing a step of planarizing an upper surface of the molding material 140 as one of a series of steps of the method for manufacturing the 3D integrated circuit (3DIC) structure 100.

Referring to FIG. 13, chemical-mechanical polishing (CMP) is performed to adjust a level of an upper surface of the molding material 140. The upper surface of the molding material 140 is planarized by applying a CMP process or a mechanical grinding process, and upper surfaces of the core balls 130 and the first semiconductor chip die 120 are exposed.

Figure 14:
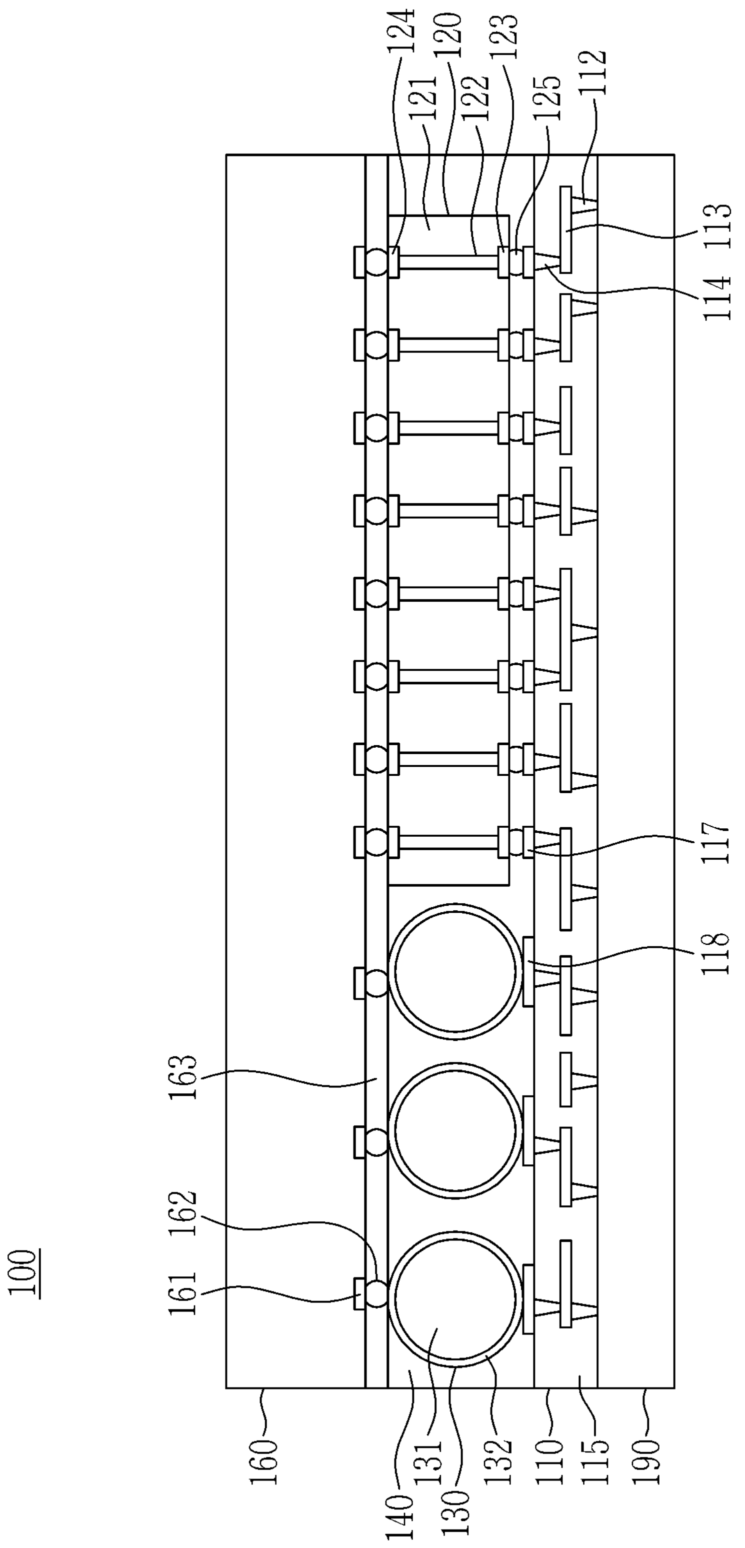
FIG. 14 is a cross-sectional view showing a step of bonding the second semiconductor chip die on the first semiconductor chip die and the core balls using a connection member as one of a series of steps of the method for manufacturing the 3D integrated circuit (3DIC) structure, and follows FIG. 13.

FIG. 14 is a cross-sectional view showing a step of bonding the second semiconductor chip die 160 on the first semiconductor chip die 120 and the core balls 130 using the connection member 162 as one of a series of steps of the method for manufacturing the 3D integrated circuit (3DIC) structure 100, and follows FIG. 13.

Referring to FIG. 14, the second semiconductor chip die 160 is bonded on the first semiconductor chip die 120 and the core balls 130. The bonding pads 124 of the first semiconductor chip die 120 and the bonding pads 161 of the second semiconductor chip die 160, and the core balls 130 and the bonding pads 161 of the second semiconductor chip die 160, may be bonded using the connection members 162. In an embodiment, the connection member 162 may include a micro-bump.

The insulating member 163 may be disposed between the first semiconductor chip die 120 and the second semiconductor chip die 160 and between the core balls 130 and the second semiconductor chip die 160 to surround the connection members 162. The insulating member 163 may be disposed between the first semiconductor chip die 120 and the second semiconductor chip die 160 and between the core balls 130 and the second semiconductor chip die 160, so that stress between the first semiconductor chip die 120 and the second semiconductor chip die 160 and stress between the core balls 130 and the second semiconductor chip die 160 are relieved.

In the embodiment for disposing the insulating member 163, before the second semiconductor chip die 160 is bonded to the first semiconductor chip die 120 and the core balls 130, a non-conductive film (NCF) that is the insulating member 163 may be attached on the planarized molding material 140. The non-conductive film (NCF) has adhesiveness, and is attached to the molding material 140. The non-conductive film (NCF) has an uncured state that may be deformed by an external force. The non-conductive film (NCF) may be attached to the molding material 140 by heating the non-conductive film (NCF) at a temperature of about 170° C. to about 300° C. for about 1 second to about 20 seconds. Next, the second semiconductor chip die 160 is stacked on the non-conductive film (NCF). The connection member 162 provided by the second semiconductor chip die 160 may pass through the non-conductive film NCF to come in contact with the core ball 130 and the first semiconductor chip die 120.

In another embodiment for disposing the insulating member 163, after the second semiconductor chip die 160 is bonded to the first semiconductor chip die 120 using the connection member 162, a space between the first semiconductor chip die 120 and the second semiconductor chip die 160 may be filled with a molded under-fill (MUF).

Figure 15:
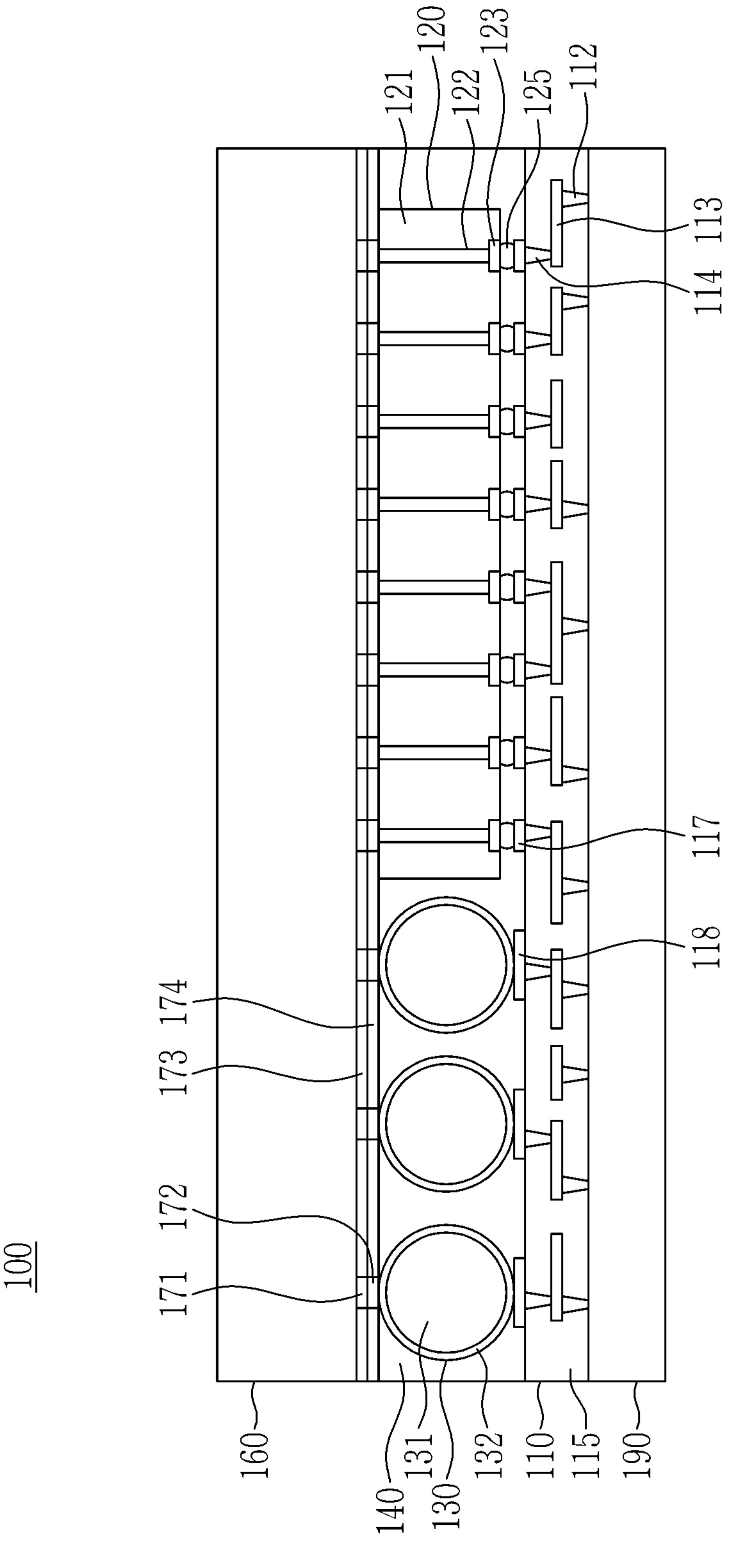
FIG. 15 is a cross-sectional view showing a step of bonding the second semiconductor chip die on the first semiconductor chip die and the core balls using the hybrid bonding as one of a series of steps of the method for manufacturing the 3D integrated circuit (3DIC) structure, and follows FIG. 13.

FIG. 15 is a cross-sectional view showing a step of bonding the second semiconductor chip die 160 on the first semiconductor chip die 120 and the core balls 130 using the hybrid bonding as one of a series of steps of the method for manufacturing the 3D integrated circuit (3DIC) structure 100, and follows FIG. 13.

Referring to FIG. 15, the bonding pad 171 and the silicon insulating layer 173 may be formed at a lower portion of the second semiconductor chip die 160, and the bonding pad 172 and the silicon insulating layer 174 may be formed at upper portions of the first semiconductor chip die 120 and the core balls 130. The bonding pad 171 at a lower portion of the second semiconductor chip die 160 is bonded to the bonding pads 172 at upper portions of the first semiconductor chip die 120 and the core balls 130 by the hybrid bonding, and the silicon insulating layer 173 at a lower portion of the semiconductor chip die 160 is bonded to the silicon insulating layer 174 at upper portions of the first semiconductor chip die 120 and the core balls 130 by the hybrid bonding. The hybrid bonding bonds two devices by fusing the same materials of the two devices using a bonding property of the same material. The hybrid means bonding the two devices by two different types, and for example, means bonding the two devices with a first type of metal-metal bonding and a second type of non-metal-non-metal bonding.

The bonding pad 171 at the lower portion of the second semiconductor chip die 160 and the bonding pads 172 at the upper portions of the first semiconductor chip die 120 and the core balls 130 may be directly bonded by the metal-metal hybrid bonding. Metal bonding is performed at an interface between the bonding pad 171 at the lower portion of the second semiconductor chip die 160 and the bonding pads 172 at the upper portions of the first semiconductor chip die 120 and the core balls 130 by the metal-metal hybrid bonding. The bonding pad 171 at the lower portion of the second semiconductor chip die 160 and the bonding pads 172 at the upper portions of the first semiconductor chip die 120 and the core balls 130 may be made of the same material so that after the hybrid bonding, there may be no interface between the bonding pad 171 at the lower portion of the second semiconductor chip die 160 and the bonding pads 172 at the upper portions of the first semiconductor chip die 120 and the core balls 130. The first semiconductor chip die 120 and the second semiconductor chip die 160 may be electrically connected to each other through the bonding pad 171 at the lower portion of the second semiconductor chip die 160 and the bonding pads 172 at the upper portions of the first semiconductor chip die 120 and the core balls 130.

The silicon insulating layer 173 at the lower portion of the second semiconductor chip die 160 and the silicon insulating layer 174 at the upper portions of the first semiconductor chip die 120 and the core balls 130 may be directly bonded by the non-metal-non-metal hybrid bonding. Covalent bonding is performed at an interface between the silicon insulating layer 173 at the lower portion of the second semiconductor chip die 160 and the silicon insulating layer 174 at the upper portions of the first semiconductor chip die 120 and the core balls 130 by the non-metal-non-metal hybrid bonding. The silicon insulating layer 173 at the lower portion of the second semiconductor chip die 160 and the silicon insulating layer 174 at the upper portions of the first semiconductor chip die 120 and the core balls 130 may be made of the same material so that after the hybrid bonding, there may be no interface between the silicon insulating layer 173 at the lower portion of the second semiconductor chip die 160 and the silicon insulating layer 174 at the upper portions of the first semiconductor chip die 120 and the core balls 130.

Through the step of bonding by performing the hybrid bonding, the second semiconductor chip die 160 is vertically stacked on the first semiconductor chip die 120 and the core ball 130.

Figure 16:
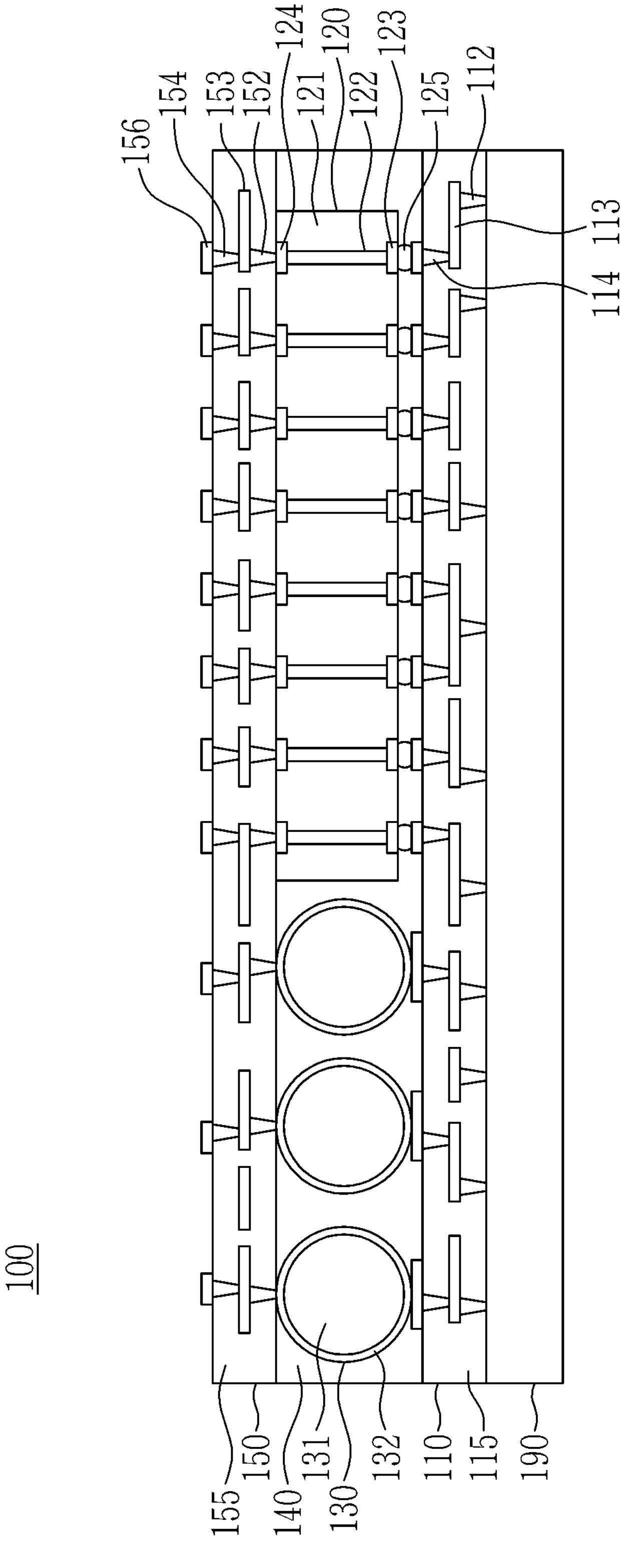
FIG. 16 is a cross-sectional view showing a step of forming the back side redistribution layer (BRDL) structure at an upper surface of the planarized molding material, an upper surface of the first semiconductor chip die, and upper surfaces of the core balls as one of a series of steps of the method for manufacturing the 3D integrated circuit (3DIC) structure, and follows FIG. 13.

FIG. 16 is a cross-sectional view showing a step of forming the back side redistribution layer (BRDL) structure 150 at an upper surface of the planarized molding material 140, an upper surface of the first semiconductor chip die 120, and upper surfaces of the core balls 130 as one of a series of steps of the method for manufacturing the 3D integrated circuit (3DIC) structure 100, and follows FIG. 13.

Referring to FIG. 16, the back side redistribution layer (BRDL) structure 150 is formed at the upper surface of the planarized molding material 140, the upper surface of the first semiconductor chip die 120, and the upper surface of the core balls 130.

First, the dielectric layer 155 is formed on the upper surface of the planarized molding material 140, the upper surface of the first semiconductor chip die 120, and the upper surfaces of the core balls 130. In an embodiment, the back side redistribution layer (BRDL) structure 150 may include a photosensitive polymer layer. In an embodiment, the back side redistribution layer (BRDL) structure 150 may include a photoimageable dielectric (PID) used in a redistribution process. As an example, the photoimageable dielectric (PID) may include a polyimide-based photosensitive polymer, a novolac-based photosensitive polymer, polybenzoxazole, a silicone-based polymer, an acrylate-based polymer, or an epoxy-based polymer. In an embodiment, the photoimageable dielectric (PID) may have a resolution of about 3 μm. In another embodiment, the dielectric layer 155 is formed of a polymer such as PBO, polyimide, or the like. In another embodiment, the dielectric layer 155 is formed of an inorganic dielectric material such as a silicon nitride, a silicon oxide, or the like. In an embodiment, the dielectric layer 155 may be formed by a CVD, ALD, or PECVD process.

After the dielectric layer 155 is formed, via holes are formed by selectively etching the dielectric layer 155, and the third redistribution vias 152 are formed by filling the via holes with a conductive material.

Next, the dielectric layer 155 is additionally deposited on the third redistribution vias 152 and the dielectric layer 155, the additionally deposited dielectric layer 155 is selectively etched to form openings, and the second redistribution lines 153 are formed by filling the openings with a conductive material.

Next, the dielectric layer 155 is additionally deposited on the second redistribution lines 153 and the dielectric layer 155, the additionally deposited dielectric layer 155 is selectively etched to form via holes, and the fourth redistribution vias 154 are formed by filling the via holes with a conductive material.

In an embodiment, the third redistribution vias 152, the second redistribution lines 153, and the fourth redistribution vias 154 may include at least one of copper, aluminum, tungsten, nickel, gold, tin, titanium, and an alloy thereof. In an embodiment, the third redistribution vias 152, the second redistribution lines 153, and the fourth redistribution vias 154 may be formed by performing a sputtering process. In another embodiment, the third redistribution vias 152, the second redistribution lines 153, and the fourth redistribution vias 154 may be formed by performing an electroplating process after forming a seed metal layer.

Thereafter, the bonding pads 156 are formed on the dielectric layer 155 to be electrically coupled to the fourth redistribution vias 154 of the back side redistribution layer (BRDL) structure 150. The bonding pads 156 may include at least one of copper, aluminum, silver, tin, gold, nickel, lead, titanium, and an alloy thereof. In an embodiment, the bonding pads 156 may be formed by performing a sputtering process. In another embodiment, the bonding pads 156 may be formed by performing an electroplating process after forming a seed metal layer.

Figure 17:
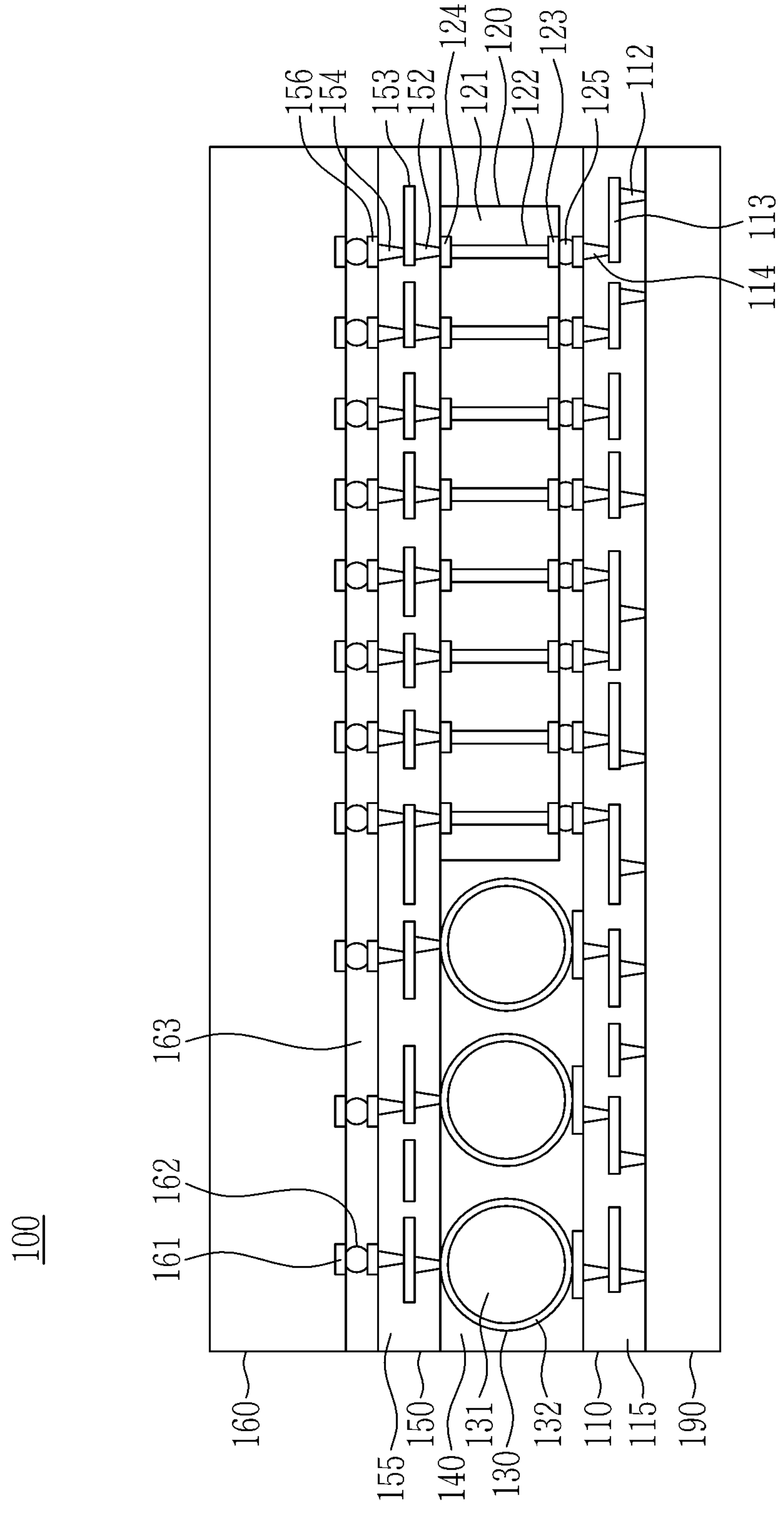
FIG. 17 is a cross-sectional view showing a step of bonding the second semiconductor chip die on the back side redistribution layer (BRDL) structure using the connection member as one of a series of steps of the method for manufacturing the 3D integrated circuit (3DIC) structure, and follows FIG. 16.

FIG. 17 is a cross-sectional view showing a step of bonding the second semiconductor chip die 160 on the back side redistribution layer (BRDL) structure 150 using the connection member 162 as one of a series of steps of the method for manufacturing the 3D integrated circuit (3DIC) structure 100, and follows FIG. 16.

Referring to FIG. 17, the second semiconductor chip die 160 is bonded on the back side redistribution layer (BRDL) structure. The bonding pads 156 of the back side redistribution layer (BRDL) structure and the bonding pads 161 of the second semiconductor chip die 160 may be bonded using the connection members 162. In an embodiment, the connection member 162 may include a micro-bump.

Figure 18:
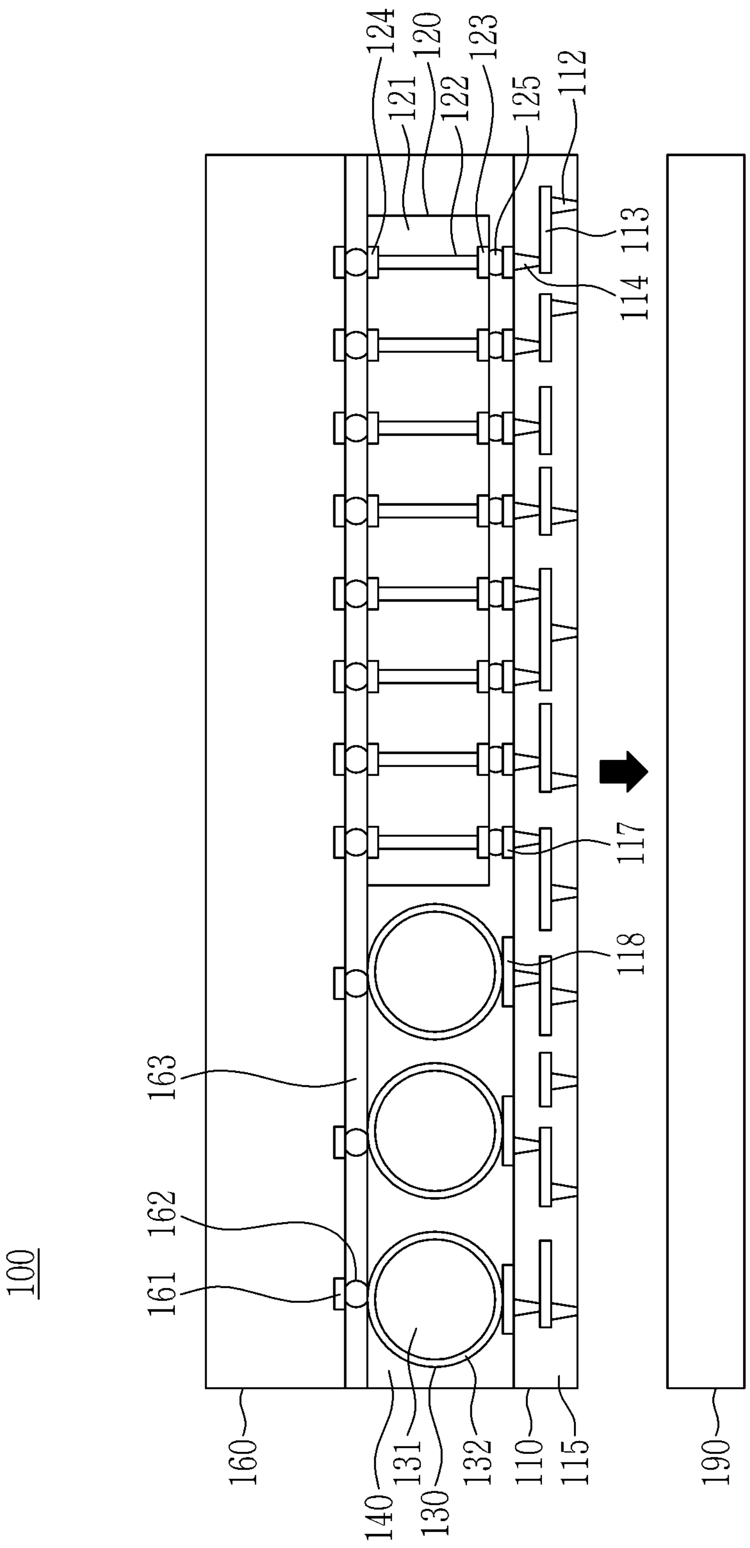
FIG. 18 is a cross-sectional view showing a step of debonding the carrier from a lower surface of the front side redistribution layer (FRDL) structure as one of a series of steps of the method for manufacturing the 3D integrated circuit (3DIC) structure.

FIG. 18 is a cross-sectional view showing a step of removing the carrier from a lower surface of the front side redistribution layer (FRDL) structure 110 as one of a series of steps of the method for manufacturing the 3D integrated circuit (3DIC) structure 100.

Referring to FIG. 18, the carrier 190 is debonded from the lower surface of the front side redistribution layer (FRDL) structure 110.

Thereafter, as shown in FIG. 1, the external connection member 116 may be formed at the front side redistribution layer (FRDL) structure 110. Referring to FIG. 1, the insulating layer 119 may be formed on the dielectric layer 115 of the front side redistribution layer (FRDL) structure 110, and the bonding pads 111 may be formed on the first redistribution vias 112. In an embodiment, the insulating layer 119 may be a solder resist. The insulating layer 119 may include a plurality of openings for soldering of the external connection member 116 and the bonding pad 111. In an embodiment, the bonding pad 111 may include at least one of copper, nickel, zinc, gold, silver, platinum, palladium, chromium, titanium, and an alloy thereof. In an embodiment, the external connection member 116 may include at least one of tin, silver, lead, nickel, copper, and an alloy thereof.

While this disclosure has been described in connection with what is presently considered to be practical embodiments, it is to be understood that the disclosure is not limited to the disclosed embodiments, but, on the contrary, is intended to cover various modifications and equivalent arrangements included within the scope of the appended claims.

What is claimed is:

1. A three-dimensional (3D) integrated circuit structure, comprising:

a redistribution layer structure;

a first semiconductor chip die on the redistribution layer structure;

a plurality of core balls on the redistribution layer structure and adjacent the first semiconductor chip die;

a molding material surrounding the first semiconductor chip die and the plurality of core balls;

an interconnection structure on the molding material; and a second semiconductor chip die on the interconnection structure, wherein a footprint of the first semiconductor chip die and footprints of the plurality of core balls are within a footprint of the second semiconductor chip die, wherein the first semiconductor chip die comprises upper bonding pads.

2. The 3D integrated circuit structure of claim 1, wherein each core ball comprises an inner core and a first outer conductive layer covering the inner core.

3. The 3D integrated circuit structure of claim 2, wherein each core ball further comprises an upper conductive connection member and a lower conductive connection member extending from the first outer conductive layer, wherein the upper conductive connection member and the lower conductive connection member each comprise a flat bonding surface.

4. The 3D integrated circuit structure of claim 2, wherein the inner core comprises a plastic material including a thermoplastic resin, a thermosetting resin, or a polymer material.

5. The 3D integrated circuit structure of claim 2, wherein the inner core comprises copper or a copper alloy.

6. The 3D integrated circuit structure of claim 2, wherein the first outer conductive layer comprises a SAC solder alloy including tin (Sn), silver (Ag), and copper (Cu).

7. The 3D integrated circuit structure of claim 2, wherein each core ball further comprises a second outer conductive layer on the first outer conductive layer.

8. The 3D integrated circuit structure of claim 1, wherein the plurality of core balls are adjacent one side of the first semiconductor chip die.

9. The 3D integrated circuit structure of claim 1, wherein some of the plurality of core balls are adjacent one side of the first semiconductor chip die, and other ones of the plurality of core balls are adjacent another side of the first semiconductor chip die.

10. A three-dimensional (3D) integrated circuit structure, comprising:

a first redistribution layer structure;

a molding material on the first redistribution layer structure;

an interconnection structure on the molding material;

a first semiconductor chip die in the molding material and comprising a first surface and a second surface opposite the first surface, wherein the first surface is electrically coupled to the first redistribution layer structure and the second surface is electrically coupled to the interconnection structure;

a plurality of core balls in the molding material and adjacent the first semiconductor chip die, wherein one portion of each core ball is electrically coupled to the first redistribution layer structure, and an opposite portion of each core ball is electrically coupled to the interconnection structure; and a second semiconductor chip die on the interconnection structure, wherein a footprint of the first semiconductor chip die and footprints of the plurality of core balls are within a footprint of the second semiconductor chip die.

11. The 3D integrated circuit structure of claim 10, wherein the interconnection structure comprises a second redistribution layer structure.

12. The 3D integrated circuit structure of claim 10, wherein the interconnection structure comprises a micro-bump.

13. The 3D integrated circuit structure of claim 10, wherein the interconnection structure comprises upper bonding pads and lower bonding pads.

14. The 3D integrated circuit structure of claim 13, wherein the upper bonding pads and the lower bonding pads are directly bonded to each other.

15. The 3D integrated circuit structure of claim 10, wherein the first semiconductor chip die comprises a through silicon via (TSV).

16. A method for manufacturing a three-dimensional (3D) integrated circuit structure, the method comprising: forming a first redistribution layer structure; bonding a plurality of core balls on the first redistribution layer structure;

mounting a first semiconductor chip die on the first redistribution layer structure;

encapsulating the first semiconductor chip die and the plurality of core balls with molding material; and electrically coupling a second semiconductor chip die to upper bonding pads of the first semiconductor chip die and to the plurality of core balls, wherein a footprint of the first semiconductor chip die and footprints of the plurality of core balls are within a footprint of the second semiconductor chip die.

17. The method of claim 16, wherein the bonding of the plurality of core balls on the first redistribution layer structure is performed by a reflow process.

18. The method of claim 16, wherein after the encapsulating the first semiconductor chip die and the plurality of core balls, the method further comprises performing a chemical-mechanical polishing (CMP) process on the molding material.

19. The method of claim 16, wherein the electrical coupling of the second semiconductor chip die to the first semiconductor chip die and the plurality of core balls comprises:

forming a second redistribution layer structure on the first semiconductor chip die and the plurality of core balls; and mounting the second semiconductor chip die on the second redistribution layer structure.

20. The method of claim 16, wherein the electrical coupling of the second semiconductor chip die to the first semiconductor chip die and the plurality of core balls is performed by hybrid bonding.

* * * * *